US005965494A

United States Patent [19]

Terashima et al.

[11] Patent Number: 5,965,494

[45] Date of Patent: Oct. 12, 1999

[54] TUNABLE RESONANCE DEVICE CONTROLLED BY SEPARATE PERMITTIVITY ADJUSTING ELECTRODES

[75] Inventors: Yoshiaki Terashima, Yokosuka; Hisashi Yoshino, Tokyo; Hiroyuki Kayano, Kawasaki; Tadahiko Maeda, Yokohama, all of Japan

[73] Assignee: Kabushiki Kaisha Toshiba, Kawasaki, Japan

[21] Appl. No.: 08/653,270

[22] Filed: May 24, 1996

[30] Foreign Application Priority Data

| | | | |
|---|---|---|---|
| May 25, 1995 | [JP] | Japan | 7-126792 |
| Mar. 15, 1996 | [JP] | Japan | 8-059804 |

[51] Int. Cl.[6] .............................. H01P 7/08; H01L 12/02

[52] U.S. Cl. .......................... 505/210; 505/700; 505/701; 505/866; 333/99 S; 333/235; 333/219

[58] Field of Search .................................... 333/219, 235, 333/205, 204, 99 S; 505/210, 700, 701, 866

[56] References Cited

U.S. PATENT DOCUMENTS

| | | | |
|---|---|---|---|
| 5,459,123 | 10/1995 | Das | 505/210 |
| 5,472,935 | 12/1995 | Yandrofski et al. | 505/210 |
| 5,694,134 | 12/1997 | Barnes | 343/700 MS |

FOREIGN PATENT DOCUMENTS

| | | | |
|---|---|---|---|
| 179201 | 8/1987 | Japan | 333/219 |
| 5075316 | 3/1993 | Japan | 333/219 |

*Primary Examiner*—Benny T. Lee
*Attorney, Agent, or Firm*—Oblon, Spivak, McClelland, Maier & Neustadt, P.C.

[57] ABSTRACT

A first electrically conductive layer whose thickness is equal to or smaller than the skin depth of the radio wave used for communication, a dielectric layer whose permittivity is changed by application of electric field, and a second electrically conductive layer whose thickness is equal to or smaller than the skin depth of the radio wave used for communication are sequentially stacked near a resonance element which is formed on the front surface of a dielectric substrate having a ground layer formed on the rear surface thereof. The effective permittivity of the dielectric layer is changed in a wide range by changing a voltage applied between the first and second electrically conductive layers to change the electric field applied to the dielectric layer. As a result, the impedance of the resonance element is changed, and when a plurality of resonance elements are arranged closely to each other to construct a filter, the coupling degree between the resonance elements is changed. Therefore, characteristics such as the resonance frequency of the resonator and the pass-band frequency of the filter are controlled by controlling a voltage to be applied.

11 Claims, 16 Drawing Sheets

TUNABLE RESONANCE DEVICE CONTROLLED BY SEPARATE PERMITTIVITY ADJUSTING ELECTRODES

BACKGROUND OF THE INVENTION

1. Field of the Invention

This invention relates to a high-frequency device used in a communication unit, and more particularly to a resonator or filter or a high frequency device using the resonator or filter.

2. Description of the Related Art

A communication unit for communicating information by wire or radio is constructed by various devices such as an amplifier, mixer, and filter and includes various devices utilizing the resonance characteristic. For example, the filter has a plurality of resonance elements and has a function of permitting passage of signals only in a specified frequency band. The filter is required to have a small insertion loss and a characteristic for inhibiting passage of signals in a frequency band other than the desired frequency band, and in order to meet the requirement, it becomes necessary to use resonance elements having a large unloaded Q value.

As a method for realizing a resonance element having a large unloaded Q value, a method using a superconducting material as a metal conductor constructing the resonance element and using a material such as sapphire or MgO having an extremely small loss as a dielectric substrate is provided. However, in this case, since the unloaded Q value becomes 10,000 or more and an extremely sharp resonance characteristic can be attained, the desired characteristic cannot be attained if the resonance characteristic is not adjusted with high precision at the stage of design.

In order to overcome the above problem, a resonator and a filter having a function of adjusting the resonance frequency is proposed (Jpn. Pat. Appln. KOKAI Publication No. 1-190001, hereinafter referred to as Document 1). In this example, the resonance element is constructed by superconductors having two different values of critical magnetic field and the resonance frequency can be changed by adjusting the intensity of the magnetic field applied to the superconductors to deteriorate the superconducting characteristic thereof. However, with this method, it is necessary to use a magnetic generator for providing a strong magnetic field to change the characteristic of the superconductor, thereby making the size of the device large.

As another method, a method using a heater provided near the resonance element formed of a superconductor and deteriorating the superconducting characteristic by heat is known (Y. Nagai, D. F. Hebert and T. Van Duzer, Appl. Phys. Lett, Vol. 63, No. 6.9 August, 1993, p. 830, "Properties of superconductive bandpass filters with thermal switches", hereinafter referred to as Document 2). With this method, the device becomes simple in construction in comparison with the method using the magnetic field as is disclosed in the document 1, but this method has a problem that the operation speed becomes low since it is necessary to supply a current to the heater for heat generation. In order to enhance the operation speed, it is necessary to maintain the environment temperature of the filter at or near the critical temperature $T_c$ of the superconductor. However, it is extremely difficult to maintain such an environment temperature.

Further, in the methods disclosed in the documents 1 and 2, the low loss property of the superconductor is sacrificed by deteriorating the superconducting characteristic of the superconductor. For this reason, there occurs a problem that the low loss property and the adjustable range are in a trade-off relationship.

Further, as a still another method, a method for changing the resonance frequency by providing a gap in the central portion of the transmission line, disposing a dielectric material whose permittivity is changed by application of voltage on the gap portion and applying a voltage to the transmission line is provided (James A. Beall, Ronald H. Ono, David Galt and John C. Price, IEEE MTT-S Digest, 1993, P.1421, "TUNABLE HIGH TEMPERATURE SUPERCONDUCTOR MICROSTRIP RESONATORS", hereinafter referred to as Document 3). However, this method has a problem that only a resonator having a unloaded Q value of 1000 or less can be realized since a gap must be provided at the current maximum point in the central portion of the transmission line used as the resonance element.

Among the conventional techniques for changing the resonance frequency as described above, the technique for changing the resonance frequency by adjusting the intensity of the magnetic field applied to the resonance element including the superconductor and deteriorating the superconducting characteristic thereof requires a magnetic generator for providing a strong magnetic field to change the characteristic of the superconductor and the size of the device becomes large.

Further, in the technique for changing the resonance frequency by heating the superconductor of the resonance element and deteriorating the superconducting characteristic thereof, the operation speed is low and the low loss property of the superconductor is sacrificed.

Further, in the technique for changing the resonance frequency by disposing a dielectric material whose permittivity is changed by application of voltage on the gap portion provided at the center of the transmission line and applying a voltage to the dielectric substance via the transmission line, a resonator having a large unloaded Q value cannot be realized.

SUMMARY OF THE INVENTION

An object of this invention is to provide a high-frequency device capable of overcoming the problems of the conventional techniques, rapidly changing the resonance frequency in a wide range in simple construction, and attaining a large unloaded Q value without sacrificing the low loss property of a superconductor when the superconductor is used for the resonance element.

According to a first aspect of this invention, there is provided a high-frequency device comprising a resonator having a resonance element formed of a superconductor; an electrically insulating layer formed on the resonator; a first electrode formed on the electrically insulating layer; a dielectric layer formed on the first electrode and having permittivity which is changed by application of electric field; a second electrode formed on the dielectric layer; and supplying means for supplying energy to the first and second electrodes to set the resonance frequency of the resonance element to a desired frequency.

According to a second aspect of this invention, there is provided a high-frequency device comprising a resonance element formed of a plate-type superconductor; a dielectric substance provided near the resonance element and having permittivity which is changed by application of electric field; a plurality of electrodes provided near the dielectric substance, for applying the electric field to the dielectric substance along the plate of the resonance element according to supplying of energy; and supplying means for supplying the energy to the plurality of electrodes to set a desired permittivity of the dielectric substance.

According to a third aspect of this invention, there is provided a high-frequency device comprising a resonance element formed of a superconductor; a dielectric substance provided near the resonance element and having permittivity which is changed by application of electric field; a plurality of comb-shaped electrodes provided near the dielectric substance and arranged perpendicular to the longitudinal direction of the resonance element; and voltage applying means for applying a voltage to the plurality of electrodes to set a desired permittivity distribution on the dielectric substance.

According to a fourth aspect of this invention, there is provided a high-frequency device comprising a dielectric substance having permittivity which is changed by application of electric field; a resonance element formed of a superconductor and formed on the dielectric layer; a plurality of ground members formed under the dielectric layer; a plurality of electrodes respectively provided between the plurality of ground members so that the plurality of ground members and the plurality of electrodes are formed in turn under the dielectric substance; and supplying means for supplying energy to the plurality of electrodes to set a desired permittivity of the dielectric substance.

According to a fifth aspect of this invention, there is provided a high-frequency device comprising a resonance element formed of a superconductor; a dielectric substance provided near the resonance element, having permittivity which is changed by application of light and having a preset distribution of at least one of the permittivity and thickness; and light application means for applying light to the dielectric substance to set a desired permittivity distribution on the dielectric substance.

According to a sixth aspect of this invention, there is provided a high-frequency device comprising a resonance element formed of a superconductor; a dielectric substance provided near the resonance element, having permittivity which is changed by application of heat and having a preset distribution of at least one of the permittivity and thickness; and heating means for applying heat to the dielectric substance to set a desired permittivity distribution on the dielectric substance.

With the above construction, the resonance frequency can be changed in simple construction. Further, a high-frequency device can be provided in which the resonance frequency can be rapidly changed in a wide range without sacrificing the low loss property of the superconductor when the superconductor is used for the resonance element and a large unloaded Q value can be attained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

There will now be described an embodiment of this invention with reference to the accompanying drawings.

First, first to seventh embodiments of a high-frequency device according to this invention are explained in which a dielectric layer and an electrically conductive layer are adequately disposed on a resonator which is constructed by a resonance element and a substrate formed of a dielectric substance and a ground layer.

The first embodiment of the high-frequency device according to this invention is explained with reference to FIG. 1.

Figure 1:
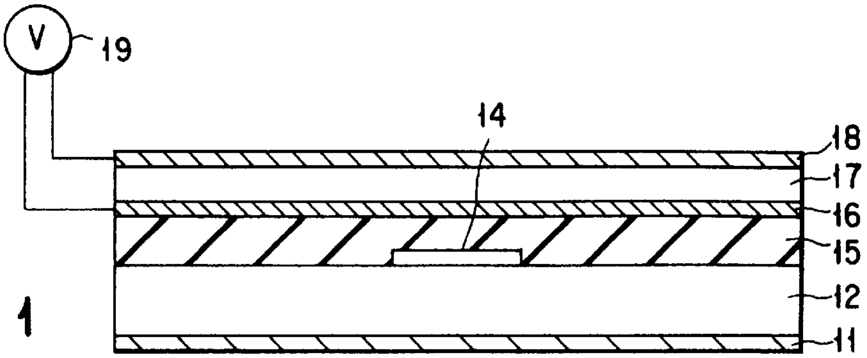
FIG. 1 is a cross sectional view showing the structure of a first embodiment of a high-frequency device according to this invention in which the permittivity is changed.

FIG. 1 is a cross sectional view showing the first embodiment of the high-frequency device according to this invention and indicates a resonator whose resonance frequency can be changed. Components for utilizing radio waves used in communication devices are constructed by various types of high-frequency devices, and among them, components using resonators are widely used. As examples thereof, a filter, oscillator and part of a matching circuit are provided. The resonance frequency of a narrow band characteristic can be obtained by reducing the loss as described before, but it becomes difficult to attain a desired characteristic at the time of design. For this reason, it is necessary to provide a function of adjusting the resonance frequency. According to the first embodiment, it becomes possible to easily meet the above requirement.

As shown in FIG. 1, the high-frequency device has a structure constructed by forming a resonator having a microstrip line structure constructed by forming a resonance element 14 on the front surface of a substrate 12 which has a ground layer 11 formed on the rear surface thereof and stacking a dielectric layer 17 whose permittivity is changed by application of a voltage V from a voltage source 19, electrodes 16, 18 for applying a voltage, and an insulating dielectric layer 15 for electrically isolating the electrode 16 from the resonance element 14 on the resonator.

The factor for determining the resonance frequency includes the length (resonance element length) of the resonance element 14 and the permittivity of the substrate 12. It is difficult to physically adjust the resonance element length. As an exceptional case, the effective resonance element length can be changed by partially deteriorating the superconducting characteristic as is disclosed in the documents 1 and 2 described before when a superconductor is used for the resonance element 14, but the low loss property of the superconductor must be sacrificed. Therefore, in this embodiment, a dielectric layer 17 whose permittivity is dependent on the electric field and first and second electrically conductive layers 16 and 18 formed on both surfaces thereof are disposed in opposition to the microstrip line type resonator. In this case, the thickness of the electrically conductive layers 16, 18 is set equal to or less than the skin depth δ of the radio wave used for communication expressed by the following equation.

$$\delta = \sqrt{1/\pi f \mu \sigma}$$

where $\mu$ denotes the magnetic permeability, f denotes the frequency of the radio wave, σ denotes the electric conductivity of the conductor.

If the thickness of the electrically conductive layers 16, 18 is set equal to or less than the skin depth δ, the radio wave will pass through the electrically conductive layers 16, 18 so that the radio wave can propagate as if no conductive layer is provided.

In the first embodiment in which the stacked structure is used, the dielectric layer used for voltage application can be made thin. In the interdigital type electrode structure formed in one plane, a device for forming a pattern is required to have high precision, but in the stacked structure, the distance between the electrodes can be easily made short. If the distance between the electrodes is made short, a voltage in the dielectric body for unit length, i.e. electric field intensity can be made high, and therefore, the voltage of the voltage source from the exterior can be lowered and a variation in the permittivity can be made large.

Next, the second embodiment of the high-frequency device according to this invention is explained with reference to FIG. 2.

Figure 2:
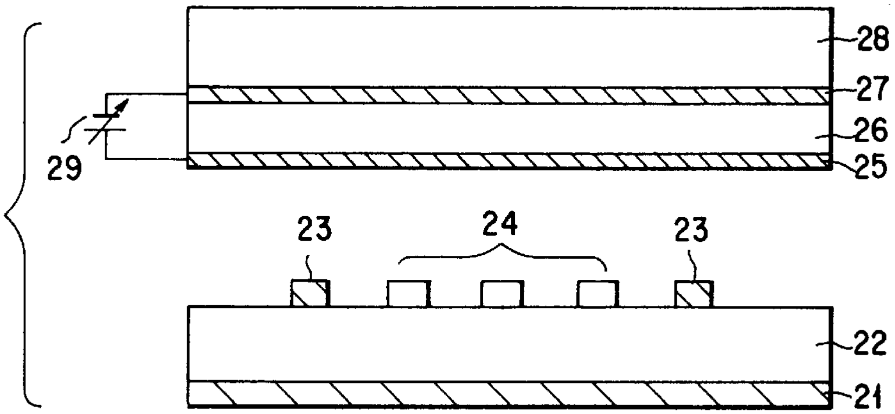
FIG. 2 is a cross sectional view showing the structure of a second embodiment of a high-frequency device according to this invention.

FIG. 2 is a cross sectional view showing the second embodiment of the high-frequency device according to this invention.

As shown in FIG. 2, the high-frequency device of the second embodiment has a pair of input/output lines 23 and resonance elements 24 formed of a superconductor on the front surface of a substrate 22 which has a ground layer 21 formed on the rear surface thereof. This constructs a microstrip line resonant filter having a so-called microstrip line as the basic structure thereof. The pair of input/output lines 23 are led out to the end portion of the substrate 22 which extends in a direction perpendicular to the drawing.

In order to prevent an influence on the electromagnetic field mode of the resonator, the thickness of the voltage application elements 25, 27 is set equal to or smaller than the skin depth when it is constructed by a normal conductor and the thickness thereof is set equal to or smaller than the penetration depth λ of the magnetic field when it is formed of a superconductor.

The high-frequency device of the second embodiment is explained in more detail. The microstrip line type resonator uses $LaAlO_3$ or MgO as the substrate 22. Y-series superconducting thin films are formed on both surfaces of the substrate by a sputtering method, the superconducting thin film formed on one surface is used as the ground layer 21, and the superconducting thin film formed on one surface is processed by an ion milling method to form the input/output lines 23 and the resonance elements 24 of desired resonance frequency, e.g. 2 GHz of the second embodiment, thus constructing a microstrip line type filter.

Further, platinum (Pt) thin films with a thickness of 10 nm used as the first and second electrically conductive layers 25, 27 and an $SrTiO_3$ thin film with a thickness of 500 nm used as the dielectric layer 26 having permittivity highly depending on the electric field are stacked on the substrate 28 formed of the MgO substrate by use of the sputtering method and the thus obtained structure is disposed in opposition to the resonance elements 24 with a Teflon layer (not shown) of 1 μm thickness disposed therebetween. A variable DC voltage source 29 is connected to the first and second electrically conductive layers 25, 27.

Figure 3:
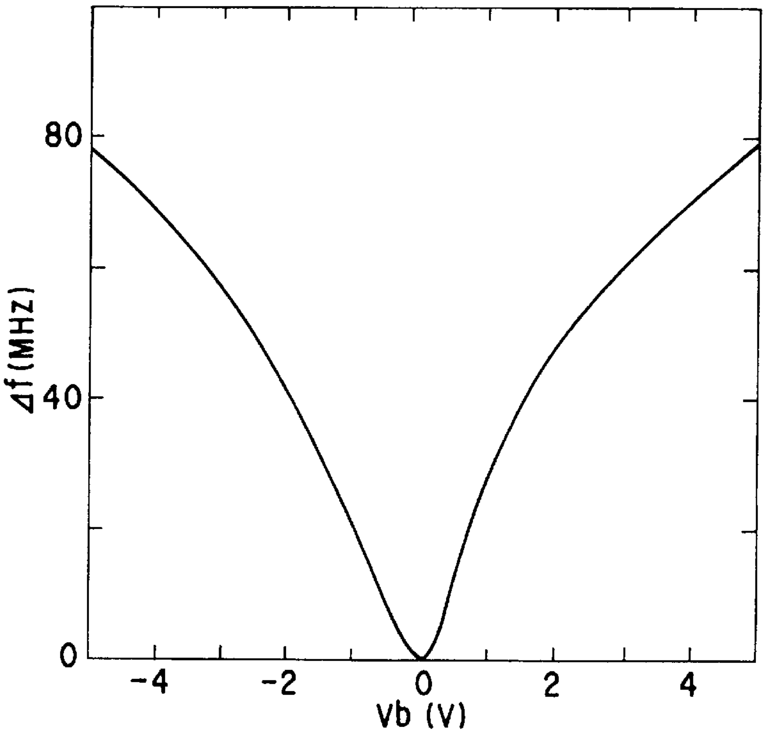
FIG. 3 is a diagram showing the relation between an application voltage Vb and a variation amount $\Delta f$ of the resonance frequency f in the high-frequency device of the second embodiment shown in FIG. 2.

In FIG. 3, the relation between a variable DC voltage Vb (V) applied between the electrically conductive layers 25 and 27 by the variable DC voltage source 29 and a deviation amount Δf (MHz) from a value of the resonance frequency f of the resonator obtained at the time of Vb=0 is shown. In this case, the measurement was made with the temperature set at 77 K (this is also true in the following description). As clearly seen from FIG. 3, Δf monotonously increases with an increase in the absolute value of Vb and Δf=80 MHz (Δf/f=4%) when Vb=5 V.

Thus, according to the second embodiment, the effective permittivity of the dielectric layer 26 can be controlled (changed) by changing the electric field applied to the dielectric layer 26 by changing the DC voltage Vb (V) applied between the first and second electrically conductive layers 25 and 27 which are formed on both surfaces of the dielectric layer 26 whose permittivity is highly dependent on the electric field. As a result, it becomes possible to rapidly change the resonance frequency f of the resonance elements 24 in a wide range.

Next, the third embodiment of the high-frequency device according to this invention is explained with reference to FIG. 4.

Figure 4:
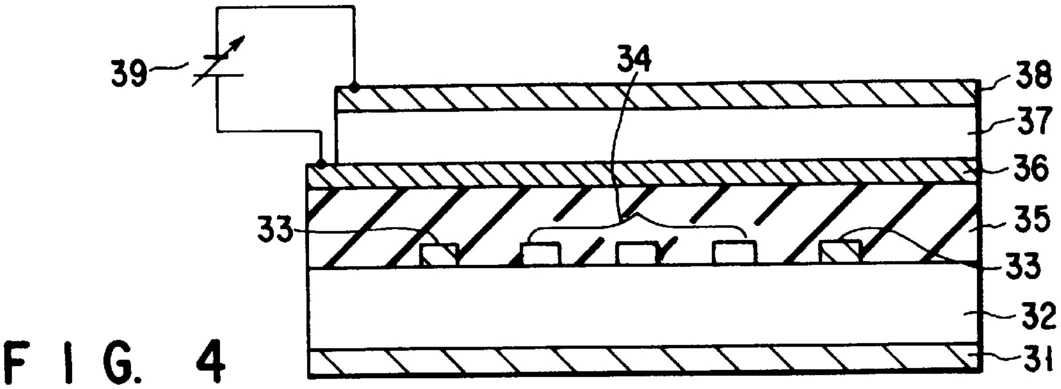
FIG. 4 is a cross sectional view sowing the structures of third and fourth embodiments of a high-frequency device according to this invention.

FIG. 4 is a cross sectional view showing the third embodiment of the high-frequency device according to this invention. In the second embodiment described above, the first and second electrically conductive layers 25, 27 and the dielectric layer 26 are formed on the substrate which is different from the substrate on which the resonance elements 24 are formed, but in the third embodiment, they are formed on the common base body.

First, a microstrip line filter having a microstrip line structure as the basic structure thereof which is constructed by forming input/output lines 33 and resonance elements 34 of a superconductor on the front surface of a substrate 32 which has a ground layer 31 formed on the rear surface thereof is provided. An $SrTiO_3$ thin film with a thickness of 100 rm is formed on the structure as an electrically insulating layer 35, a Pt thin film with a thickness of 10 nm is formed on the $SrTiO_3$ thin film as a first electrically conductive layer 36, an $SrTiO_3$ thin film with a thickness of 500 nm is formed on the Pt thin film as a dielectric layer 37 whose permittivity is dependent on the electric field, and a Pt thin film having a thickness of 10 nm like the first electrically conductive layer 36 is formed as a second electrically conductive layer 38 on the $SrTiO_3$ thin film.

Also, in the high-frequency device of the third embodiment, the dependency of a deviation amount Δf (MHz) from a value of the resonance frequency f obtained at the time of Vb=0 on a variable DC voltage Vb (V) applied between the electrically conductive layers 36 and 38 by a variable DC voltage source 39 which is similar to that of the second embodiment is obtained.

Next, the fourth embodiment of the high-frequency device according to this invention is explained.

In the fourth embodiment, the structure is similar to that of the third embodiment except that a $Ba_xSr_{2-x}TiO_3$ (x indicates a replace amount of Sr by Ba and is equal to or less than 1) is used as the dielectric layer 37 whose permittivity is dependent on the electric field. It was confirmed that the value of Δf increased or decreased according to x in al case where Δf was measured while x was changed with Vb kept at a constant value of 5 V, but in either case, the resonance frequency was changed depending on the voltage Vb.

Next, the fifth embodiment of the high-frequency device according to this invention is explained with reference to FIGS. 5 and 6.

Figure 5:
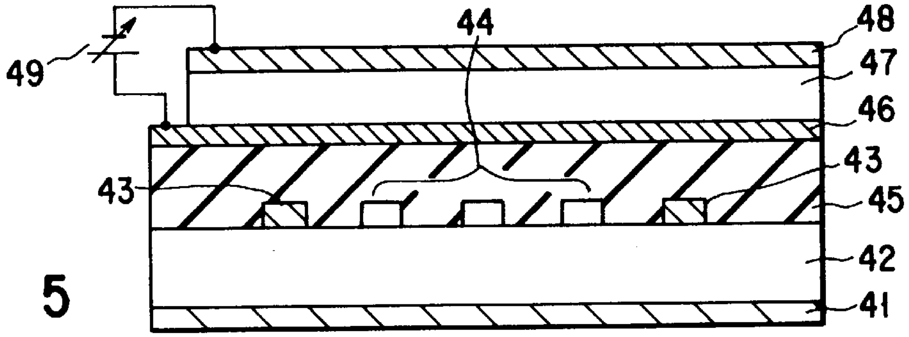
FIG. 5 is a cross sectional view showing the structure of a fifth embodiment of a high-frequency device according to this invention in which a different electric conductor is used.

FIG. 5 is a cross sectional view showing the fifth embodiment of the high-frequency device according to this invention.

In the fifth embodiment, first, a microstrip line filter having a microstrip line structure as the basic structure thereof which is constructed by forming input/output lines 43 and resonance elements 44 of a superconductor on the front surface of a substrate 42 which has a ground layer 41 formed on the rear surface thereof is provided. An $SrTiO_3$ thin film with a thickness of 100 nm, for example, is formed on the structure as an electrically insulating layer 45, a Y-series superconducting thin film with a thickness of 10 nm is formed on the $SrTiO_3$ thin film as a first electrically conductive layer 46, an $SrTiO_3$ thin film with a thickness of 500 nm is formed on the conductive layer 46 as a dielectric layer 47 whose permittivity is dependent on the electric field from a voltage V applied from a voltage source 19 field, and a Pt thin film with a thickness of 10 nm is formed on the dielectric layer 47 as a second electrically conductive layer 48.

That is, the fifth embodiment has basically the same structure as the third embodiment, but is different from the third embodiment in that the first and second electrically conductive layers 46, 48 formed on both surfaces of the dielectric layer 47 having the electric field highly dependency are formed of different materials. The structure in which different materials are used for the two electrically conductive layers formed on both surfaces of the dielectric layer whose permittivity has the electric field dependency can be combined with the structure of the first to fifth embodiments.

Figure 6:
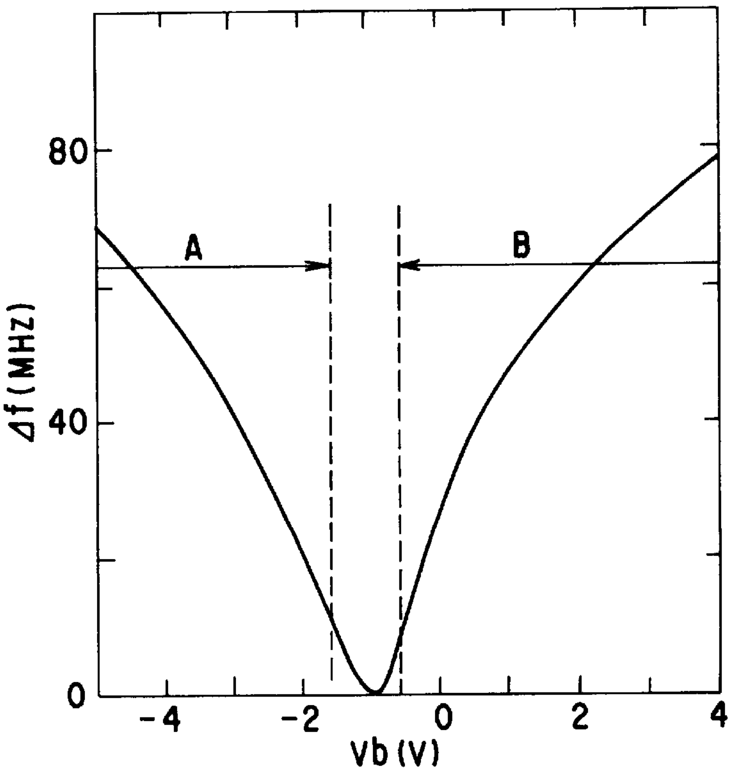
FIG. 6 is a diagram showing the relation between an application voltage Vb and a variation amount $\Delta f$ of the resonance frequency f in the high-frequency device of the fifth embodiment shown in FIG. 5.

FIG. 6 shows the relation between a variable DC voltage Vb (V) applied between the electrically conductive layers 46 and 48 by a variable DC voltage source 49 (see FIG. 5) and a deviation amount Δf (MHz) from a value of the resonance frequency f of the resonator obtained at the time of Vb=0 in the fifth embodiment. The thickness 10 nm of the superconducting thin film which is the first electrically conductive layer 46 is sufficiently smaller than the penetration depth of magnetic field λ. As is clearly seen from FIG. 6, the minimum value of Δf is obtained at a voltage value deviated from Vb=0 by approx. 1 V which is approximately equal to a difference between the work functions of the two types of electrically conductive thin films.

In a case where two types of electrically conductive materials having different work functions are used for the first and second electrically conductive layers 46 and 48 and the resonance frequency is controlled by a voltage applied between the electrically conductive layers 46 and 48 as in the fifth embodiment, it is preferable to set the variation range of the application voltage so as not to contain a difference between the work functions of the two types of electrically conductive materials as indicated by a region A or B in FIG. 6. That is, it is preferable to control that the voltage Vb does not have two values as to an arbitrary Δf.

Next, the sixth embodiment of the high-frequency device according to this invention is explained with reference to FIG. 7.

Figure 7:
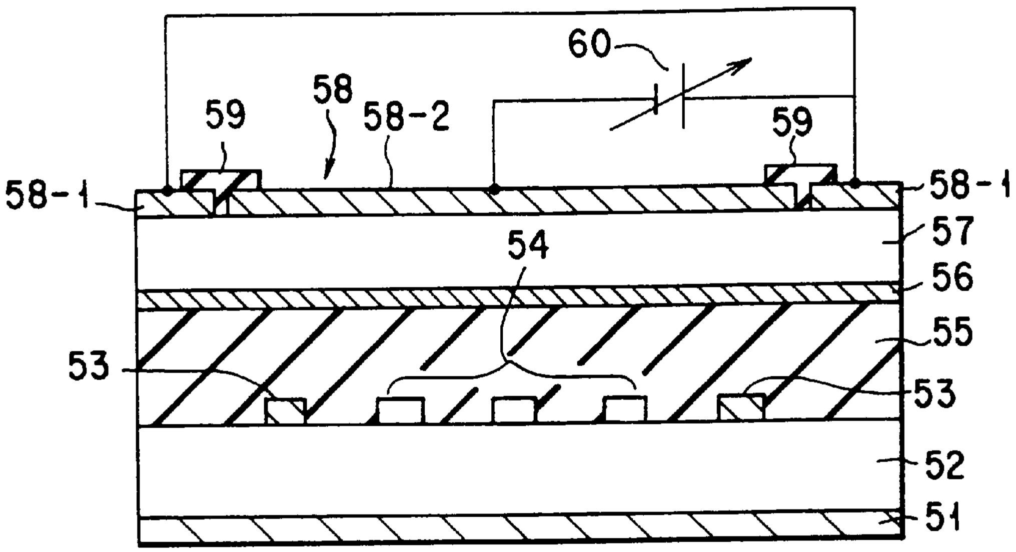
FIG. 7 is a cross sectional view showing the structure of a sixth embodiment of a high-frequency device according to this invention in which a voltage application region is divided.

FIG. 7 is a cross sectional view showing the sixth embodiment of the high-frequency device according to this invention. The sixth embodiment is similar to the third embodiment in the materials of the respective portions, but is different from the third embodiment in the voltage application method and the structure of the voltage application electrodes for the dielectric layer whose permittivity has the electric field dependency.

First, as shown in FIG. 7, a microstrip line filter having a microstrip line structure as the basic structure thereof which is constructed by forming input/output lines 53 and resonance elements 54 of a superconductor on the front surface of a dielectric substrate 52 which has a ground layer 51 formed on the rear surface thereof is provided. An electrically insulating layer 55 is formed on the microstrip line resonator, and a first electrically conductive layer 56, a dielectric layer 57 whose permittivity has the electric field dependency, and a second electrically conductive layer 58 are sequentially stacked on the electrically insulating layer 55.

The second electrically conductive layer 58 is divided into two regions (voltage application regions) 58-1 and 58-2 in the same plane and a variable DC voltage is applied between the two voltage application regions 58-1 and 58-2 from a variable DC voltage source 60. The two voltage application regions 58-1 and 58-2 are formed with a distance of 1 mm by use of a metal mask. An protection film 59 for electrical insulating is formed on the boundary portion between the voltage application regions 58-1 and 58-2.

In the structure of this embodiment, a first capacitor having two electrodes constructed by the first electrically conductive layer 56 and the voltage application region 58-1 of the second electrically conductive layer 58 and a second capacitor having two electrodes constructed by the first electrically conductive layer 56 and the other voltage application region 58-2 of the second electrically conductive layer 58 are serially connected and the electric field is applied to the dielectric layer 57 via the above capacitors. Also, in this case, the resonance frequency f is changed depending on the application voltage Vb.

Thus, in the sixth embodiment, the voltage application electrodes connected to the variable DC voltage source 60 can be formed in the second electrically conductive layer 58 which lies on the same plane and it is not necessary to form the voltage application electrodes on the first electrically conductive layer 56. For this reason, the high-frequency device shown in FIG. 7 can be easily manufactured.

In the sixth embodiment, the second electrically conductive layer 58 is divided into plural sections, but the same effect can be attained by dividing the first electrically conductive layer 56 into plural sections.

Figure 8:
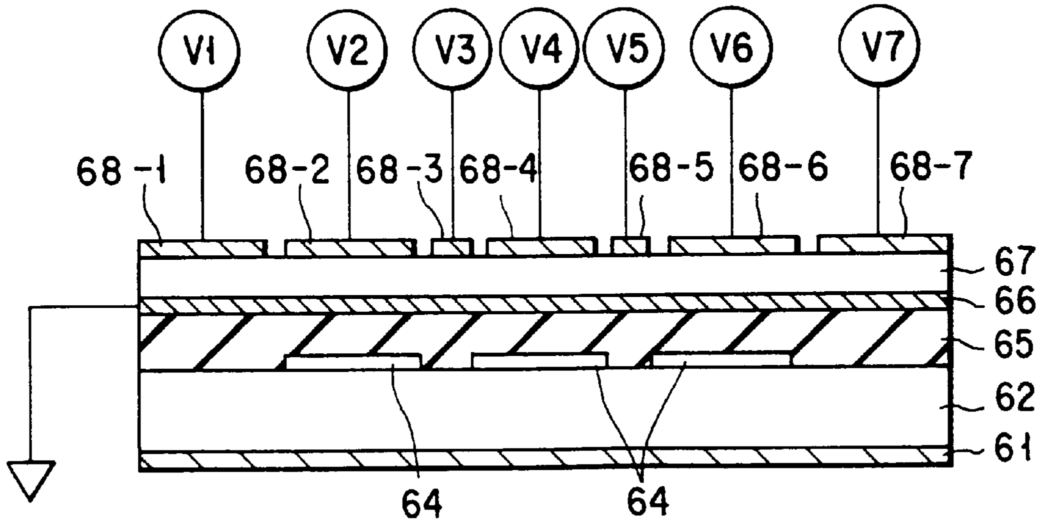
FIG. 8 is a cross sectional view showing the structure of a seventh embodiment of a high-frequency device according to this invention in which the permittivity is set in a desired distribution.

Next, the seventh embodiment of the high-frequency device according to this invention is explained with reference to FIG. 8.

The seventh embodiment has basically the same structure as that of the first embodiment. That is, it has a structure constructed by forming a resonator having a microstrip line structure constructed by forming a resonance elements 64 on a dielectric substrate 62 which has a ground layer 61 formed on the rear surface thereof and stacking a dielectric layer 67 whose permittivity is changed by application of voltage (V1, V2, V3, V4, V5, V6, and V7), electrodes 66, (68-1, 68-2, 68-3, 68-4, 68-5, 68-6, and 68-7) for applying a voltage, and an insulating dielectric layer 65 for electrically isolating the voltage application element 66 from the resonance elements 64 on the resonator.

However, unlike the first embodiment, in the seventh embodiment, in order to set the permittivity of the dielectric layer 67 in a desired distribution, the voltage application element 68 is divided into plural voltage application elements 68-1 to 68-7 and different voltages are applied to the voltage application elements 68-1 to 68-7. As a result, it becomes possible to realize a desired permittivity distribution in the dielectric layer 67. Thus, it becomes possible to control the resonance frequency and freely set the coupling coefficient between the resonators. The desired permittivity distribution indicates a distribution which permits the filter characteristic and the like to be adequately adjusted. In the following description, the term “the desired distribution” has the same meaning.

As described above, in the first to seventh embodiments in which the dielectric layer and electrically conductive layers are adequately formed on the resonator constructed by the resonance element and substrate formed of the dielectric layer and ground layer, the microstrip line resonator is explained as the resonator, but a resonator of strip line structure or planar structure can be used, and this invention can be applied to the resonator of the above structure.

As described above, according to the first to seventh embodiments of this invention, the resonance frequency can be changed in simple construction, the resonance frequency can be rapidly changed in a wide range without sacrificing the low loss property of superconductor when the superconductor is used for the resonance element, and a high-frequency device having a large unloaded Q value can be provided.

Next, the eighth to twenty-fourth embodiments of the high-frequency device according to this invention having a structure for changing the permittivity of the dielectric layer disposed near the resonance element by application of electric field along the plate of the resonance element.

First, the eighth embodiment of the high-frequency device according to this invention is explained with reference to FIGS. 9A and 9B.

Figure 9A:
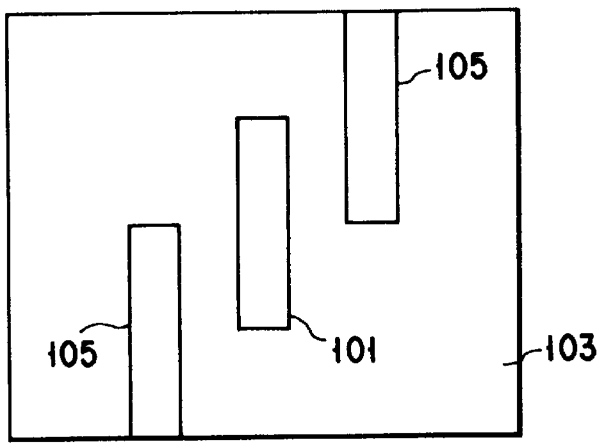
FIGS. 9A and 9B are views showing the structure of an eighth embodiment of a high-frequency device according to this invention in which the permittivity is controlled by supply of energy from the exterior.
Figure 9B:
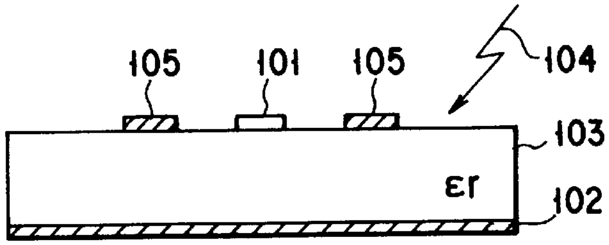

FIGS. 9A and 9B show a resonator whose resonance frequency is variable as the high-frequency device according to the eight embodiment of this invention.

The high-frequency device of the eighth embodiment constructs a microstrip line resonator having a so-called microstrip line structure as the basic structure constructed by forming a resonance element 101 and input/output lines 105 which are formed of a superconductor on the front surface of a dielectric substrate 103 having a ground layer 102 formed on the rear surface thereof as shown in FIG. 9B.

The factor for determining the resonance frequency includes the length (resonance element length) of the resonance element 101 and the relative permittivity $\epsilon_r$ of the dielectric substrate 103. It is difficult to physically adjust the resonance element length. As an exceptional case, the effective resonance element length can be changed by partially deteriorating the superconducting characteristic as is disclosed in the documents 1 and 2 described before when a superconductor is used for the resonance element 101, but the low loss property of the superconductor must be sacrificed. Therefore, in this embodiment, the dielectric layer 103 is formed of a dielectric material whose relative permittivity $\epsilon_r$ can be changed by application of energy from the exterior and a method for changing the resonance frequency by changing the relative permittivity $\epsilon_r$ thereof by use of external energy 104 and changing the impedance of the resonance element 101 is used. In this case, as the energy 104 applied to the dielectric substrate 103 from the exterior, a voltage, light, heat, pressure, magnetic field or the like can be used as shown in FIG. 9B.

Further, in the shape of another transmission line type resonator using a dielectric body and conductor this invention can be applied to a resonator of different transmission line type using a dielectric body and conductor. As the shape of the transmission line, a strip line type and coplanar type can be used, for example. In the case of a microstrip line resonator of this embodiment, the resonance frequency f can be given by the following equation.

$$f = nc/2l\sqrt{\varepsilon_{eff}} \qquad (1)$$

where n is a natural number, c is the speed of light, 1 is the resonance element length, and $\epsilon_{eff}$ is the effective permittivity of the dielectric substrate 103.

When $\epsilon_{eff}$ is changed by $\pm\Delta\epsilon_{eff}$, the resonance frequency change Δf/f can be given by the following expression (2).

$$\frac{\Delta f}{f} = \sqrt{\frac{\varepsilon_{eff}}{\varepsilon_{eff} \pm \Delta\varepsilon_{eff}}} - 1 \qquad (2)$$

In practice, in a case where the resonator of 4 GHz band is constructed with the structure shown in FIGS. 9A and 9B and the effective permittivity $\epsilon_{eff}$ is changed by 20%, the resonance frequency f can be changed by 400 MHz.

Next, the ninth embodiment of the high-frequency device according to this invention is explained with reference to FIGS. 10 and 11.

Figure 10:
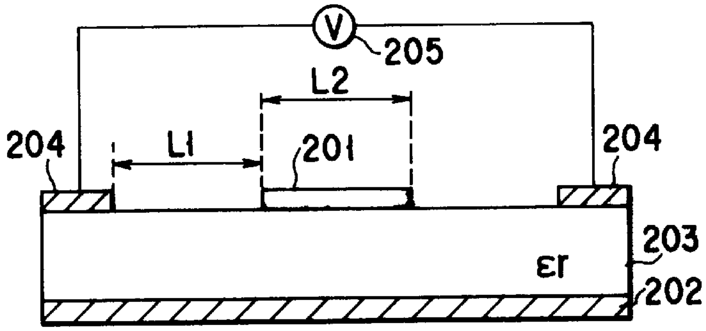
FIG. 10 is a cross sectional view showing the structure of a ninth embodiment of a high-frequency device according to this invention in which the permittivity is changed by application of voltage.

FIG. 10 is a cross sectional view showing the high-frequency device according to the ninth embodiment of this invention. Like the eighth embodiment, in this embodiment, the microstrip line structure is used. The high-frequency device has a resonance element 201 and voltage application electrodes 204 formed on the front surface of a dielectric substrate 203 having a ground layer 202 formed on the rear surface thereof and the relative permittivity $\epsilon_r$ of the dielectric substrate 203 can be changed by applying a voltage V to the electrodes 204 from a variable voltage source 205.

According to the ninth embodiment, since the voltage application electrodes 204 are formed on the same surface of the dielectric substrate 203 on which the resonance element 201 and input/output lines (not shown) are formed, they can be formed in the same process and the cost can be lowered. In the ninth embodiment, a material whose permittivity is changed by application of voltage is used for the dielectric substrate 203.

Figure 11:
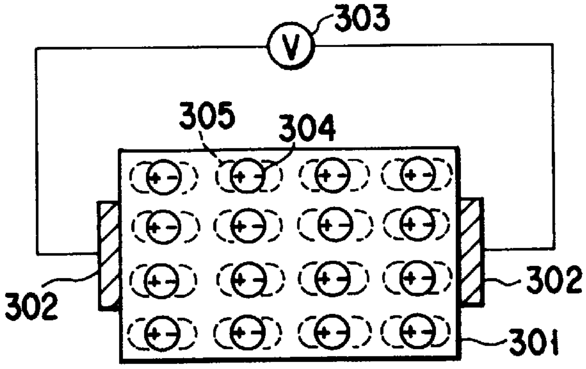
FIG. 11 is a diagram for illustrating an example of a dielectric substance whose permittivity is changed by application of voltage in the ninth embodiment shown in FIG. 10.

FIG. 11 is a diagram showing a concrete example of a dielectric substrate. The dielectric substrate 301 causes spontaneous polarization 304 on the molecular level, and when a voltage V is applied from a voltage source 303 to electrodes 302 formed on both side surfaces of the dielectric substrate 301 of some material to create an external electric field, the quantum of the spontaneous polarization 304 varies as indicated by broken lines 305 and the permittivity thereof is changed. According to this method, since the permittivity can be changed only by changing the voltage value, the resonance frequency can be rapidly changed. As a material of the dielectric body whose permittivity is changed according to an applied voltage, for example, PSZT or $Ba_xSr_{1-x}TiO_3$ (x indicates a replace amount of Sr by Ba and is equal to or less than 1 ) based on $SrTiO_3$ or $BaTiO_3$ may be used.

Further, when the high-frequency device is formed with the microstrip line structure as shown in FIG. 10 and if a distance between the resonance element 201 and the voltage application electrode 204 is set to L1 and the resonance element width of the resonance element 201 is set to L2, it is preferable to satisfy the condition that L1>L2.

Next, the tenth embodiment of the high-frequency device according to this invention is explained with reference to FIG. 12.

Figure 12:
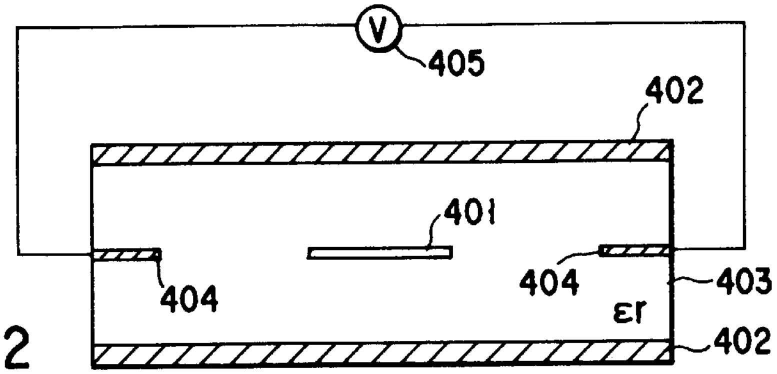
FIG. 12 is a cross sectional view showing the structure of a tenth embodiment of a high-frequency device according to this invention in which the strip line structure is used.

FIG. 12 is a cross sectional view showing the high-frequency device according to the tenth embodiment of this invention in which the strip line structure is used unlike the eighth and ninth embodiments. That is, ground layers 402 are formed on the front and rear surfaces of a dielectric substrate 403 whose relative permittivity $\epsilon_r$ is changed by application of a voltage V to the electrodes 404 from a variable source 405 and a resonance element 401 and voltage application electrodes 404 are disposed in the same plane in the dielectric substrate 403. The high-frequency device of the tenth embodiment is similar to that of the ninth embodiment except that the whole structure is the strip line structure and the same effect as that of the ninth embodiment can be obtained.

Next, the eleventh embodiment of the high-frequency device according to this invention is explained with reference to FIGS. 13A and 13B.

Figure 13A:
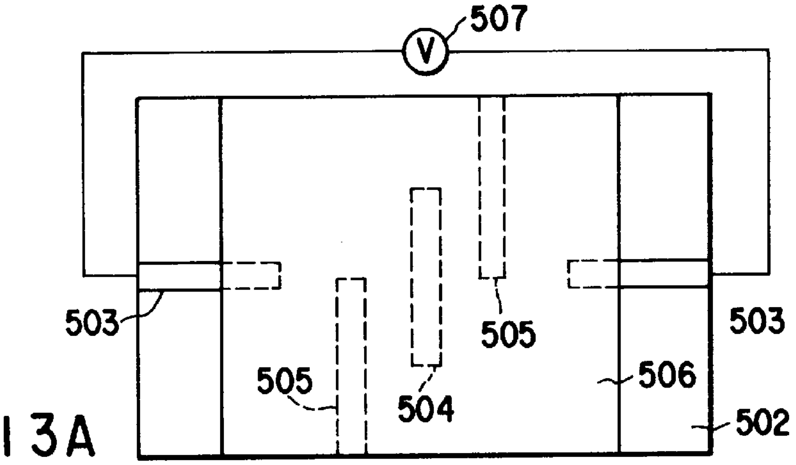
FIGS. 13A and 13B are views showing the structure of an eleventh embodiment of a high-frequency device according to this invention in which a dielectric layer is formed on the resonator of microstrip line structure.
Figure 13B:
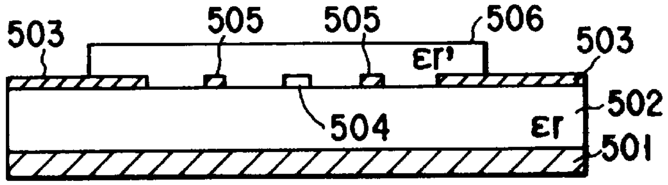

FIGS. 13A and 13B are views showing the high-frequency device according to the eleventh embodiment of this invention which is formed with the microstrip structure by forming a resonance element 504, voltage application electrodes 503 and input/output lines 505 on the front surface of a dielectric substrate 502 having a permittivity $\epsilon_r$ and having a ground layer 501 (see FIG. 13B) formed on the rear surface thereof and in which a dielectric layer 506 whose relative permittivity $\epsilon_r$ is changed by an application voltage is formed to cover the resonance element 504, voltage application electrodes 503 and part of the input/output lines 505. The voltage application electrodes 503 are connected to a variable voltage source 507 for generating a DC voltage V.

The eleventh embodiment is effective in a case where the resonance element 504 is formed of superconductor. In a case where a superconducting thin film having an excellent characteristic is formed on the dielectric substrate 502 as the resonance element 504, it is necessary to use a dielectric material having a lattice constant which is approximately equal to that of the superconductor for the dielectric substrate 502. In this case, if a superconductor is used for a substrate having a different lattice constant, distortion occurs in a path through which a superconducting current flows, thereby degrading the characteristic. If a dielectric material which satisfies the condition that the lattice constant thereof is approximate to that of the superconductor used for the resonance element 504 and the condition that the permittivity thereof is changed by application of voltage cannot be obtained as a material used for the dielectric substrate 502, the resonance element 504 is formed on the dielectric substrate 502 having the lattice constant approximately equal to that of the superconductor and the relative permittivity $\epsilon_r$ as in this embodiment. Then, a dielectric layer 506 formed of a dielectric material which has relative permittivity $\epsilon_r'$ different from the relative permittivity $\epsilon_r$ (see FIG. 13B) of the dielectric substrate 502 and whose relative permittivity is changed by application of voltage is formed by sputtering or the like.

Thus, in the eleventh embodiment, the impedance of the resonance element 504 is changed by changing a voltage applied to the dielectric layer 506 via the voltage application electrodes 503 from the variable voltage source 504 in the high-frequency device in which the resonance element 504 is formed of superconductor and the resonance characteristic such as the resonance frequency can be changed.

Further, according to the eleventh embodiment, since the resonance characteristic can be changed without deteriorating the superconducting characteristic of the superconductor as is disclosed in the documents 1 and 2, it becomes unnecessary to use a large-scale magnetic field generator for generating a strong magnetic field for deteriorating the superconducting characteristic or a heater having a problem in the operation speed. Further, since it is not necessary to deteriorate the superconducting characteristic, an advantage that the low loss property of the superconductor is not sacrificed can be attained.

Next, the twelfth embodiment of the high-frequency device according to this invention is explained with reference to FIG. 14.

Figure 14:
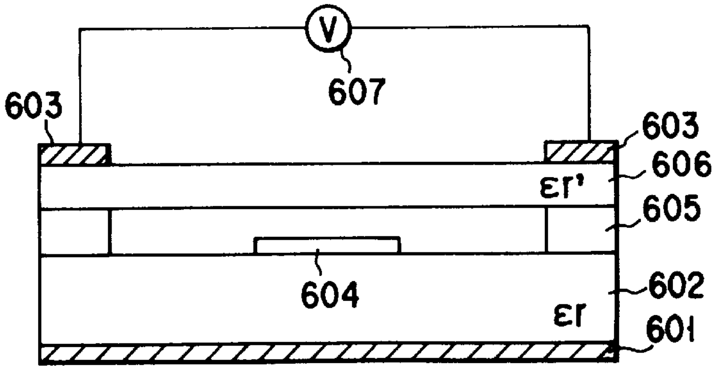
FIG. 14 is a cross sectional view showing the structure of a twelfth embodiment of a high-frequency device according to this invention in which a dielectric layer is formed on the resonator with a spacer disposed therebetween.

FIG. 14 is a cross sectional view showing the high-frequency device according to the twelfth embodiment of this invention. The microstrip structure is constructed by forming a resonance element 604 of superconductor on the front surface of a dielectric substrate 602 with relative permittivity $\epsilon_r$ having a ground layer 601 formed on the rear surface thereof. Further, like the eleventh embodiment, the substrate 602 is formed of a material having a lattice constant which is approximately equal to that of the superconductor of the resonance element 604. A dielectric layer 606 whose relative permittivity $\epsilon_r'$ ($\epsilon_r' \neq \epsilon_r$) is changed by application of voltage is formed over the dielectric substrate 602 while a spacer 605 whose thickness is larger than that of the resonance element 604 is disposed therebetween and voltage application electrodes 603 are formed on the dielectric layer 606. The voltage application electrodes 603 are connected to a variable voltage source 607 for generating a DC voltage V.

In general, the loss caused in a dielectric material used for the dielectric layer 606 whose permittivity $\epsilon_r'$ is changed by application of voltage is larger than that caused in another material. In this case, the unloaded Q value of the resonator is determined by the amount of loss caused in the dielectric layer 606. Therefore, in the twelfth embodiment, the amount of loss in the dielectric layer 606 influencing the characteristic of the resonator is reduced by separating the dielectric layer 606 from the resonance element 604 by use of the spacer 605, and thus a large unloaded Q value can be obtained. In this case, the voltage application electrodes 603 are formed on the dielectric layer 606 as shown in FIG. 14 and a variable voltage source 607 for generating a DC voltage is connected to the voltage application electrodes.

Thus, according to the twelfth embodiment, like the eleventh embodiment, the impedance of the resonance element 604 can be changed and the resonance characteristic such as the resonance frequency can be changed by changing the permittivity of the dielectric layer 606 by application of voltage without using a large-scale magnetic field generator for generating a strong magnetic field for deteriorating the superconducting characteristic or a heater having a problem in the operation speed and without degrading the superconducting characteristic.

Next, the thirteenth embodiment of the high-frequency device according to this invention is explained with reference to FIGS. 15A and 15B.

Figure 15A:
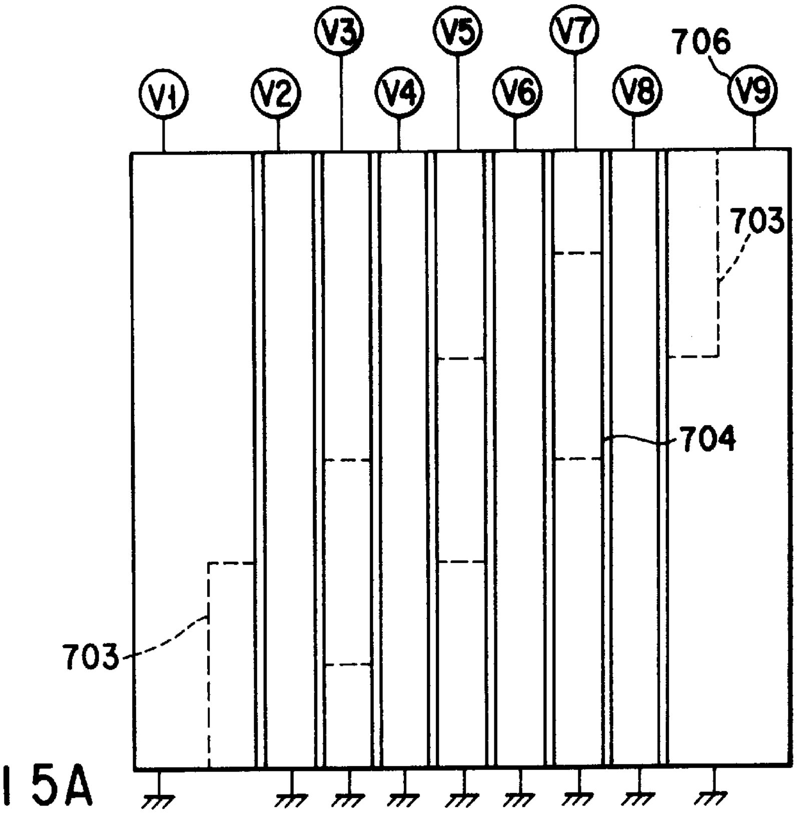
FIGS. 15A and 15B are views showing the structure of a thirteenth embodiment of a high-frequency device according to this invention in which a plurality of resonance elements are used to construct a filter.
Figure 15B:
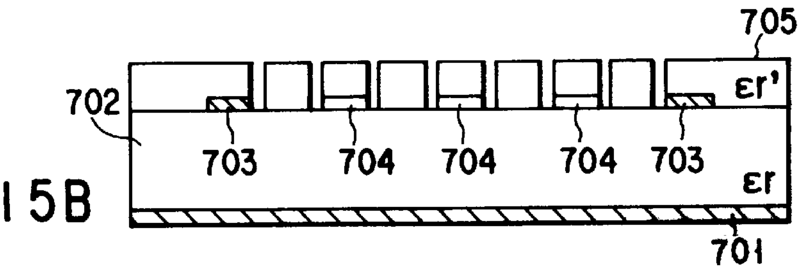

FIGS. 15A and 15B are views showing the high-frequency device according to the thirteenth embodiment of this invention. In the thirteenth embodiment, the microstrip structure is constructed by forming input/output lines 703 and a plurality of resonance elements 704 on the front surface of a dielectric substrate 702 with a relative permittivity $\epsilon_r$ having a ground layer 701 formed on the rear surface thereof and dielectric layers 705 whose relative permittivity $\epsilon_r'$ is changed by application of voltage (V1, V2, V3, V4, V5, V6, V7, V8 and V9) are formed on the dielectric substrate 702 to construct a multi-stage filter as shown in FIG. 15B.

In order to adjust the filter characteristic and resonance frequency of each resonance element in the high-frequency device with the above structure, it is necessary to adjust the coupling coefficient between the resonance elements and the coupling amount of the external Q as well as the resonance element length. When an attempt is made to adjust all of the adjustment portions and if the number of stages of the filter (the number of resonance elements 704) is set to n, it is necessary to make adjustments on (2n+1) portions. Therefore, in this embodiment, the dielectric layers 705 are respectively formed on the stages of the filter and the effective resonance length, the coupling factor between the resonance elements and the coupling amount of the external Q are changed by application of a DC voltage from a variable voltage source 706 (see FIG. 15A) to the dielectric layers 705 via voltage application electrodes (not shown) formed on the end portions of the dielectric layers 705. With this structure, the resonance frequency and filter characteristic can be easily adjusted to desired characteristics.

Next, the fourteenth embodiment of the high-frequency device according to this invention is explained with reference to FIGS. 16A and 16B.

Figure 16A:
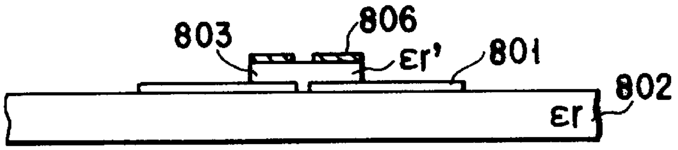
FIGS. 16A and 16B are views showing the structure of a fourteenth embodiment of a high-frequency device according to this invention in which a gap is formed in the resonance element.
Figure 16B:
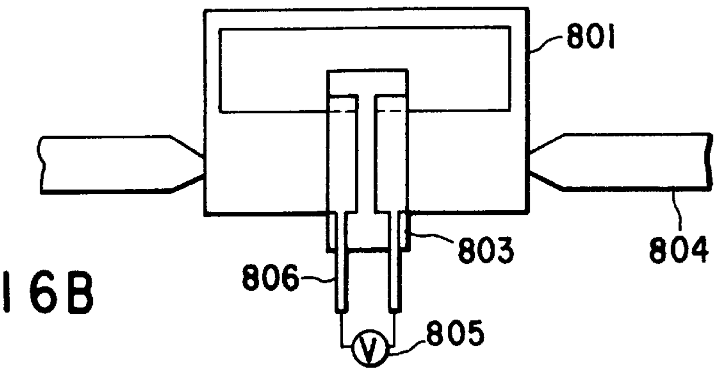

FIGS. 16A and 16B show the high-frequency device according to the fourteenth embodiment of this invention which is a resonator having a resonance element 801 constructed by a narrow line portion and a wide line portion having a gap formed on a dielectric substrate 802 with a relative permittivity $\epsilon_r$ (see FIG. 16A). The resonance element 801 is connected to input/output lines 804 (see FIG. 16B). In this case, the resonance element 801 causes resonance at substantially a frequency fo expressed by the following equation (3) and determined by the inductance L (not shown) of the narrow line portion and the capacitance C (not shown) of the gap in the wide line portion.

$$fo = 1/\sqrt{LC} \tag{3}$$

In this case, it is necessary to make a design by taking parasitic components such as a parasitic capacitance and loss into consideration in order to obtain an accurate value.

Further, a dielectric layer 803 whose permittivity $\epsilon_r'$ is changed by application of voltage is formed on the gap portion of the resonance element 801. Voltage application electrodes 806 for applying a DC voltage V from a variable voltage source 805 are formed on the dielectric layer 803. As shown in FIG. 16B, the electrodes 806 are formed to provide a high impedance line as viewed from the propagating radio wave by making the line width thereof sufficiently small. With this structure, a large unloaded Q value can be maintained without leaking the radio wave energy. Further, the resonance frequency fo can be changed by changing the application voltage from the variable voltage source 805 to the dielectric layer 803 and changing the capacitance C by the gap of the resonance element 801. In the case of the microstrip line structure constructed by forming a ground layer on the rear surface of the dielectric substrate 802, the technique in this embodiment can be used.

Next, the fifteenth embodiment of the high-frequency device according to this invention is explained with reference to FIGS. 17A and 17B.

Figure 17A:
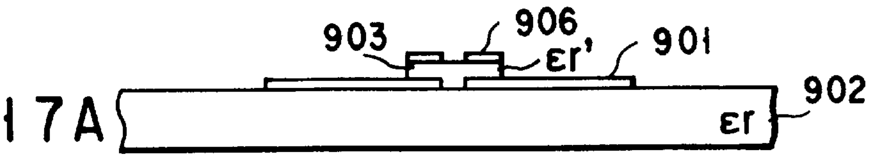
FIGS. 17A and 17B are views showing the structure of a fifteenth embodiment of a high-frequency device according to this invention in which a gap is formed in the resonance element.
Figure 17B:
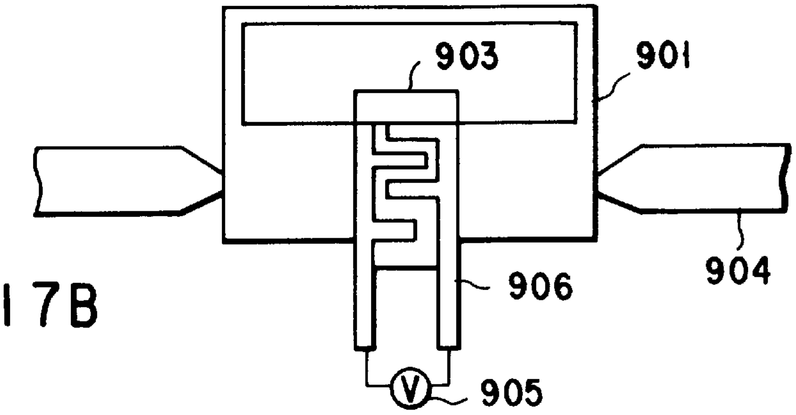

FIGS. 17A and 17B show a resonator in which the resonance frequency can be lowered as the high-frequency device according to the fourteenth embodiment of this invention. Like the fourteenth embodiment, in the fifteenth embodiment, a resonance element 901 (see FIG. 17A) constructed by a narrow line portion and a wide line portion having a gap is formed on a dielectric substrate 902 with a relative permittivity $\epsilon_r$ (see FIG. 17A), the resonance element 901 is connected to input/output lines 904 (see FIG. 17B), a dielectric layer 903 (see FIG. 17B) whose permittivity $\epsilon_r'$ is changed by application of voltage is formed on the gap portion of the resonance element 901, and voltage application electrodes 906 (see FIG. 17B) for applying a voltage from a variable voltage V source 905 are formed on the dielectric layer 903.

In this embodiment, the area of the opposing surfaces of the gap is increased by forming those portions of the voltage application electrodes 906 which lie on the gap portion of the resonance element 901 in a comb form. With this structure, since the capacitance C by the gap of the resonance element 901 can be increased, the resonance frequency fo can be lowered as is clearly understood from the equation (3). In this case, the voltage application electrode 906 can be formed with a structure different from that of the conductor of the resonance element 901. Further, in the case of the microstrip line structure constructed by forming a ground layer on the rear surface of the dielectric substrate 902, the technique in this embodiment can be used.

Next, the sixteenth embodiment of the high-frequency device according to this invention is explained with reference to FIGS. 18A and 18B.

Figure 18A:
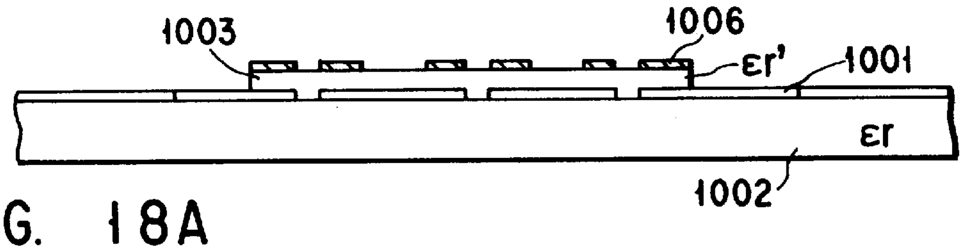
FIGS. 18A and 18B are views showing the structure of a sixteenth embodiment of a high-frequency device according to this invention in which a plurality of resonance elements which are the same as the resonance element shown in FIGS. 16A and 16B are used to construct a filter.
Figure 18B:
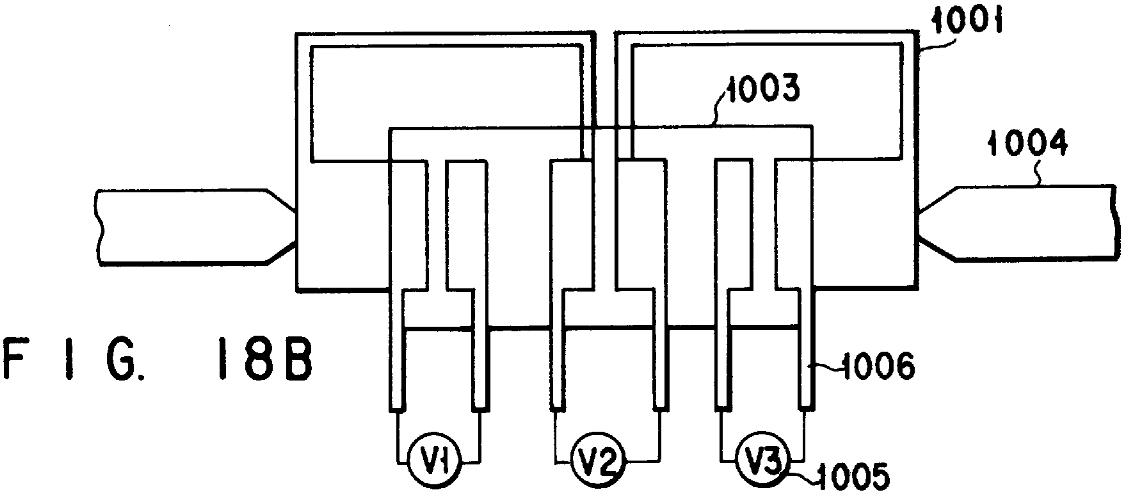

FIGS. 18A and 18B show a filter constructed by arranging a plurality of resonance elements 1001 (in an example of FIGS. 18A and 18B, two resonance elements) which are formed on a dielectric substrate 1002 with a relative permittivity $\epsilon_r$ and each constructed by the inductance of a narrow line portion and the capacitance of a gap formed in a wide line portion as explained in the fourteenth embodiment as the high-frequency device according to the fourteenth embodiment of this invention. The resonance element 1001 is connected to input/output lines 1004 (see FIG. 18B). A dielectric layer 1003 whose permittivity $\epsilon_r'$ is changed by application of voltage is formed on the gap portions of the respective resonance elements 1001 and gap portions between the resonance elements 1001, and voltage application electrodes 1006 for applying voltages V1, V2, V3 from variable voltage sources 1005 are formed in positions corresponding to the gap portions on the dielectric layer 1003 as shown in FIG. 18B. The resonance frequency and the coupling coefficient between the resonance elements can be changed by changing the application voltages V1, V2, V3 and changing the capacitances of the gap portions, of the resonance elements 1001. Further, when the external Q is required to be adjusted, the adjustment can be made by changing the application voltages V1, V2, V3.

Next, the seventeenth embodiment of the high-frequency device according to this invention is explained with reference to FIG. 19.

Figure 19:
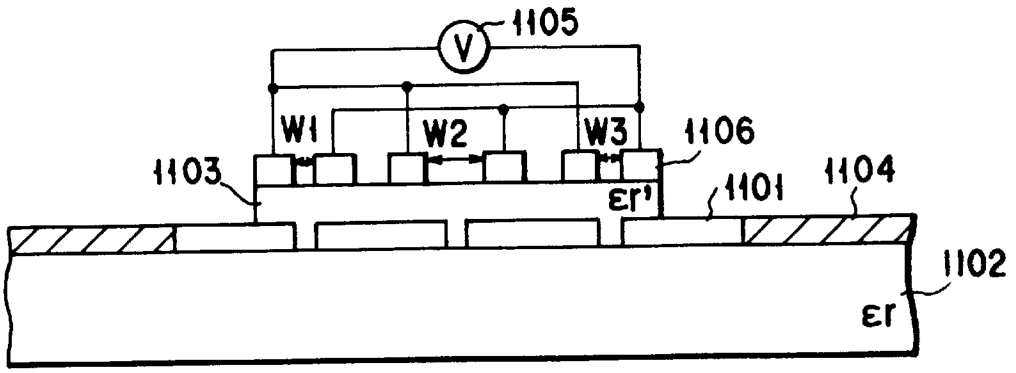
FIG. 19 is a cross sectional view showing the structure of a seventeenth embodiment of a high-frequency device according to this invention in which the distance between the electrodes is controlled.

FIG. 19 is a view showing the high-frequency device according to the seventeenth embodiment of this invention in which variable items can be simultaneously adjusted by use of one variable voltage source 1105. In the high-frequency device, a resonance element 1101 having a plurality of gaps is formed on a dielectric substrate 1102 with a relative permittivity $\epsilon_r$, the resonance element is connected to input/output lines 1104, a dielectric layer 1103 whose relative permittivity $\epsilon_r'$ is changed by application of a voltage V is formed on the resonance element 1101, and voltage application electrodes 1106 are formed in positions corresponding to the gaps of the resonance element 1101 on the dielectric layer 1103. Further, one variable voltage source 1105 is commonly connected to the voltage application electrodes 1106. In this case, the variable degree can be adjusted by changing distances W1, W2, W3 between the voltage application electrodes 1106 or the widths of the voltage application electrodes 1106, and as a result, the distribution of the permittivity of the dielectric layer 1103 can be adjusted to attain the desired characteristic.

Next, the eighteenth embodiment of the high-frequency device according to this invention is explained with reference to FIG. 20.

Figure 20:
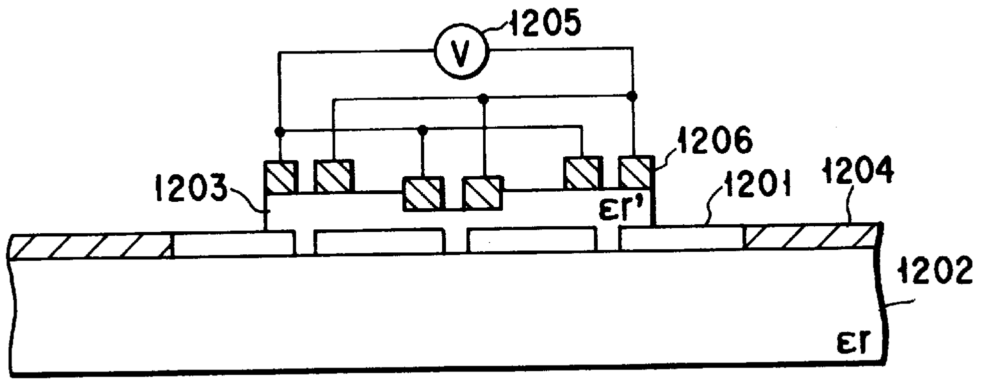
FIG. 20 is a cross sectional view showing the structure of an eighteenth embodiment of a high-frequency device according to this invention in which the thickness of a dielectric layer formed on the resonator is adjusted.

FIG. 20 is a view showing the high-frequency device according to the eighteenth embodiment of this invention in which variable items can be simultaneously adjusted by use of one variable voltage source 1205 like the case of the seventeenth embodiment. However, unlike the seventeenth embodiment, in this embodiment, the electrode width of each voltage application electrode 1206 is made constant and a dielectric layer 1203 is formed to have a preset thickness distribution so as to attain a desired permittivity distribution.

That is, in the eighteenth embodiment, a resonance element 1201 having a plurality of gaps is formed on a dielectric substrate 1202 with a relative permittivity $\epsilon_r$, the resonance element is connected to input/output lines 1204, the dielectric layer 1203 whose relative permittivity $\epsilon_r'$ is changed by application of a voltage V is formed on the resonance element 1201, and the voltage application electrodes 1206 having the same electrode width are formed in positions corresponding to the respective gaps of the resonance element 1201 on the dielectric layer 1203 and one variable voltage source 1205 is commonly connected to the voltage application electrodes 1206. In this respect, this embodiment is similar to the seventeenth embodiment, but in the eighteenth embodiment, the thickness of the dielectric layer 1203 is made different in positions corresponding to the gaps. With this structure, the distribution of the permittivity of the dielectric layer 1203 can be adjusted to attain the desired characteristic.

Next, the nineteenth embodiment of the high-frequency device according to this invention is explained with reference to FIG. 21.

Figure 21:
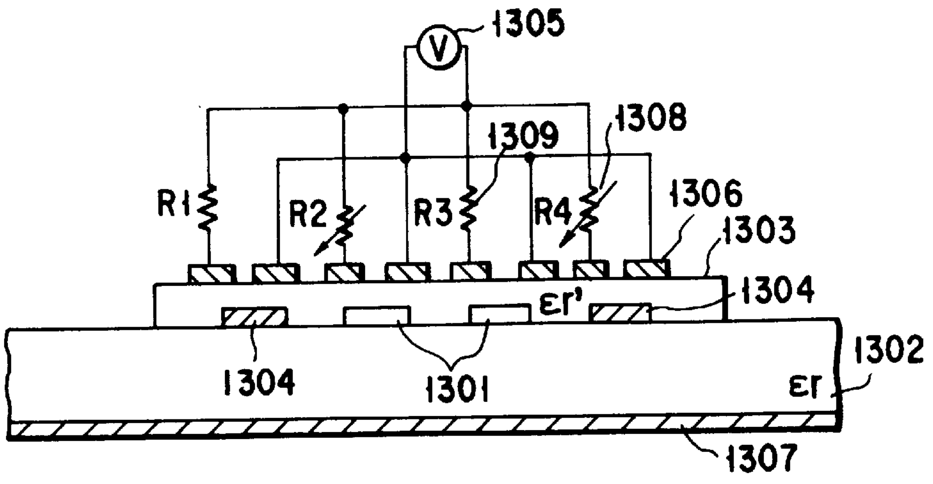
FIG. 21 is a cross sectional view showing the structure of a nineteenth embodiment of a high-frequency device according to this invention in which an application voltage is controlled by use of a resistor.

FIG. 21 is a view showing the high-frequency device according to the nineteenth embodiment of this invention. The high-frequency device is so constructed that voltages can be applied to voltage application electrodes 1306 from one common variable voltage source 1305 via variable resistors 1308 (R2, R4) or resistors 1309 (R1, R3) and a desired voltage distribution can be attained by changing the application voltage by use of the variable resistors 1308.

That is, in the nineteenth embodiment, a resonance element 1301 having a plurality of gaps and input/output lines 1304 are formed on a dielectric substrate 1302 with a relative permittivity $\epsilon_r$ and having a ground layer 1307 formed on the rear surface thereof, a dielectric layer 1303 whose permittivity is changed by application of voltage is formed on the resonance element 1301, voltage application electrodes 1306 are formed in positions corresponding to the respective gaps of the resonance element 1301 on the dielectric layer 1303, and the variable voltage source 1305 is connected to the voltage application electrodes 1306 via the variable resistors 1308 or resistors 1309. With this structure, the distribution of the permittivity of the dielectric layer 1303 can be adjusted to attain the desired characteristic.

In order to change the application voltage, it is possible to use another passive element such as an inductance element or capacitance element other than the resistor and it is also possible to use a circuit constructed by an active element.

Next, the twentieth embodiment of the high-frequency device according to this invention is explained with reference to FIGS. 22A and 22B.

Figure 22A:
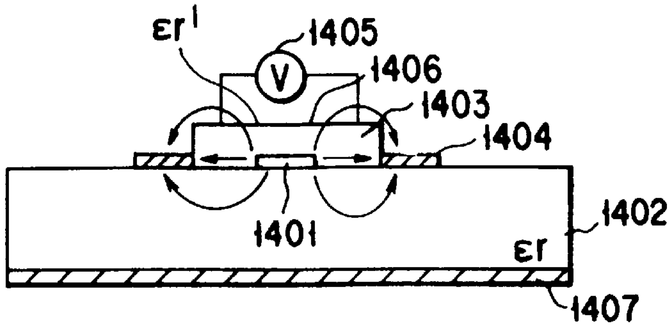
FIGS. 22A and 22B are views showing the structure of a twentieth embodiment of a high-frequency device according to this invention in which the thickness of the electrode is set equal to or less than the skin depth δ.
Figure 22B:
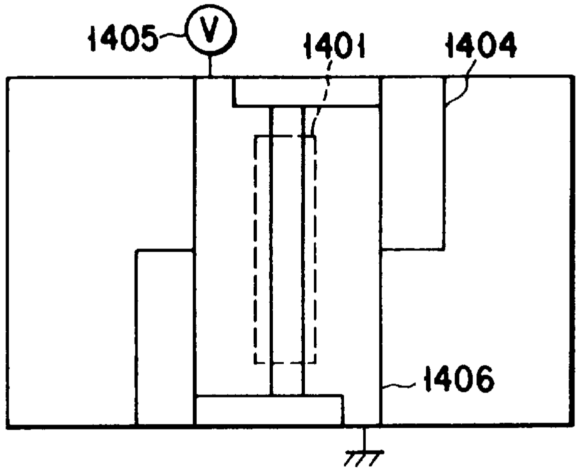

FIGS. 22A and 22B are views showing the high-frequency device according to the twentieth embodiment of this invention. In the twentieth embodiment, the high-frequency device is so constructed that a resonance element 1401 and input/output lines 1404 are formed on the front surface of a dielectric substrate 1402 with a relative permittivity $\epsilon_r$ and having a ground layer 1407 formed on the rear surface thereof, a dielectric layer 1403 whose relative permittivity $\epsilon_r'$ is changed by application of a voltage V is formed on the resonance element 1401 as shown in FIG. 22A, and a variable voltage source 1405 is connected to voltage application electrodes 1406 formed on the dielectric layer 1403 to apply a DC voltage to the voltage application electrodes 1406 so as to change the permittivity of the dielectric layer 1403, and the thickness of the voltage application electrode 1406 is set equal to or less than the skin depth a of δ the radio wave in the application frequency of the high-frequency device. The skin depth δ is expressed by the following equation (4).

$$\delta = \sqrt{1/\pi f \mu \sigma} \tag{4}$$

where f denotes the application frequency of the high-frequency device, μ denotes the magnetic permeability, σ denotes the electric conductivity of the voltage application electrode.

Thus, since the radio wave will penetrate the conductor of the electrode 1406 if the thickness of the voltage application electrode 1406 is set equal to or less than the skin depth δ, it becomes possible to propagate the radio wave with low loss approximately equal to that caused in a case where the electrode 1406 is not provided.

Next, the twenty-first embodiment of the high-frequency device according to this invention is explained with reference to FIGS. 23A and 23B.

Figure 23A:
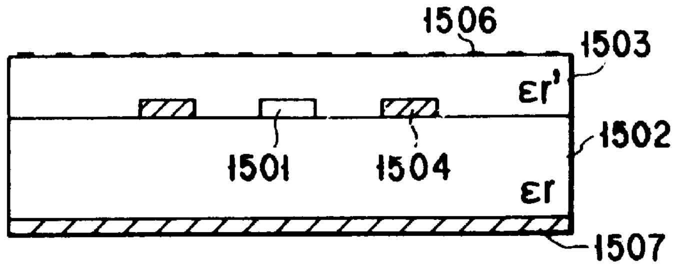
FIGS. 23A and 23B are views showing the structure of a twenty-first embodiment of a high-frequency device according to this invention in which the thickness of the electrode is set equal to or less than the skin depth δ and the electrode is formed in an interdigital form.
Figure 23B:
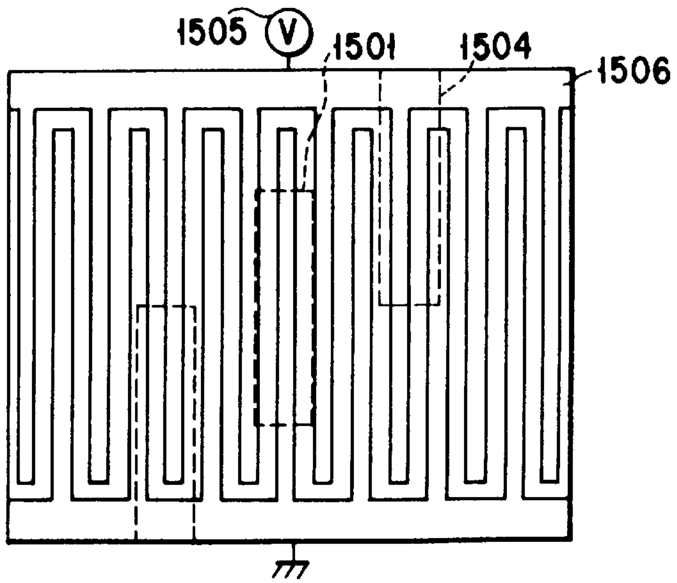

FIGS. 23A and 23B are views showing the high-frequency device according to the twenty-first embodiment of this invention. In the twenty-first embodiment, the high-frequency device of microstrip line structure constructed by a resonance element 1501 and input/output lines 1504 formed on the front surface of a dielectric substrate 1502 with a relative permittivity $\epsilon_r$ and having a ground layer 1507 formed on the rear surface thereof is provided, a dielectric layer 1503 whose relative permittivity $\epsilon_r'$ is changed by application of a voltage V is formed on the resonance element 1501 as shown in FIG. 23A, interdigital voltage application electrodes 1506 (see FIG. 23B) having a thickness equal to or less than the skin depth δ expressed by the equation (4) are formed on the dielectric layer 1503, and a variable voltage source 1505 is connected to the voltage application electrodes 1506.

According to this embodiment, the same effect as that obtained in the twentieth embodiment can be attained. Further, the structure of the twenty-first embodiment is effective when voltages are applied from a plurality of portions to local portions of the dielectric layer 1503 via the interdigital voltage application electrodes 1506.

Figure 24A:
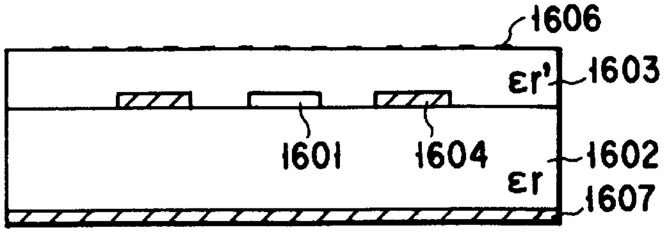
FIGS. 24A and 24B are views showing the structure of a twenty-second embodiment of a high-frequency device according to this invention in which the shape of the electrode on the resonator is modified from that of the twenty-first embodiment.
Figure 24B:
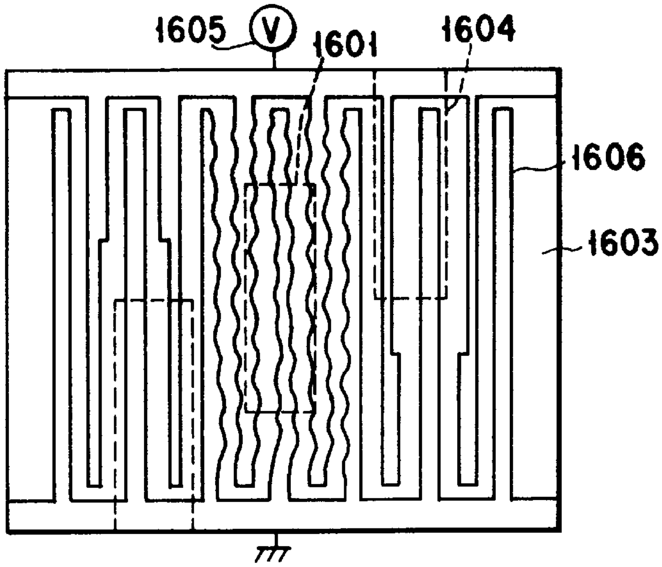

Next, the twenty-second embodiment of the high-frequency device according to this invention is explained with reference to FIGS. 24A and 24B., FIGS. 24A and 24B are views showing the high-frequency device according to the twenty-second embodiment of this invention. In the twenty-second embodiment, the high-frequency device of microstrip line structure constructed by a resonance element 1601 and input/output lines 1604 formed on the front surface of a dielectric substrate 1602 with a relative permittivity $\epsilon_r$ and having a ground layer 1607 formed on the rear surface thereof is provided, as shown if FIG. 24A, a dielectric layer 1603 whose relative permittivity $\epsilon_r'$ is changed by application of a voltage V is formed on the resonance element 1601, interdigital voltage application electrodes 1606 having a thickness equal to or less than the skin depth δ expressed by the equation (4) are formed on the dielectric layer 1603, and a variable voltage source 1605 (see FIG. 24B) is connected to the voltage application electrodes 1606. In the twenty-second embodiment, the shape of the interdigital voltage application electrodes 1606 lying over the resonance element 1601 are modified from that of the twenty-first embodiment.

According to the twenty-second embodiment, the same effect as that obtained in the twentieth embodiment can be attained, and in addition, an advantage that the permittivity of the dielectric layer 1603 can be set to a desired distribution can be attained by changing the shape and electrode width of the interdigital voltage application electrode 1606.

Next, the twenty-third embodiment of the high-frequency device according to this invention is explained with reference to FIGS. 25A and 25B.

Figure 25A:
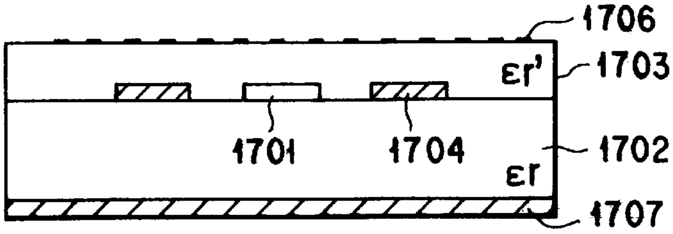
FIGS. 25A and 25B are views showing the structure of a twenty-third embodiment of a high-frequency device according to this invention in which different voltage values are applied unlike the case of the twenty-first embodiment.
Figure 25B:
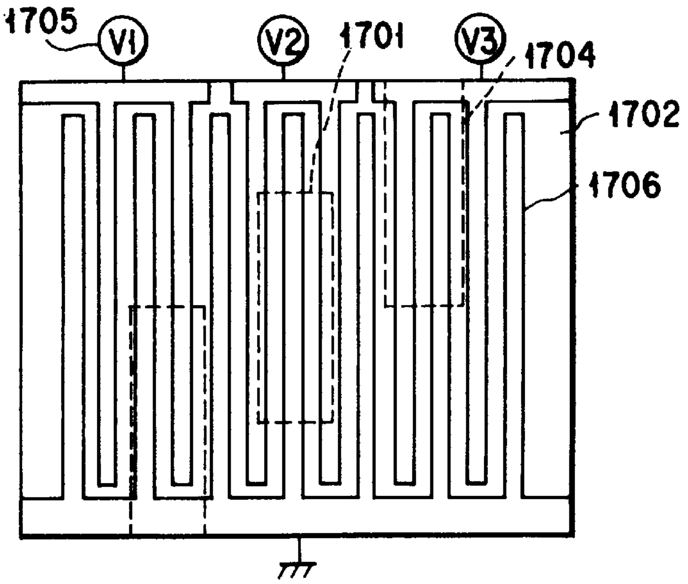

FIGS. 25A and 25B are views showing the high-frequency device according to the twenty-third embodiment of this invention. In the twenty-third embodiment, the high-frequency device of microstrip line structure constructed by a resonance element 1701 and input/output lines 1704 formed on the front surface of a dielectric substrate 1702 with a relative permittivity $\epsilon_r$ and having a ground layer 1707 (see FIG. 25A) formed on the rear surface thereof is provided, a dielectric layer 1703 (see FIG. 25A) whose relative permittivity $\epsilon_r'$ is changed by application of voltage (V1, V2, V3) is formed on the resonance element 1701, and interdigital voltage application electrodes 1706 having a thickness equal to or less than the skin depth δ expressed by the equation (4) are formed on the dielectric layer 1703. Further, a plurality of variable voltage sources 1705 (see FIG. 25B) are connected to the voltage application electrodes 1706 so as to make it possible to change the permittivity of the dielectric layer 1703 in plural positions. Also, in the twenty-third embodiment, the same effect as that obtained in the twentieth embodiment can be attained.

Next, the twenty-fourth embodiment of the high-frequency device according to this invention is explained with reference to FIGS. 26A and 26B.

Figure 26A:
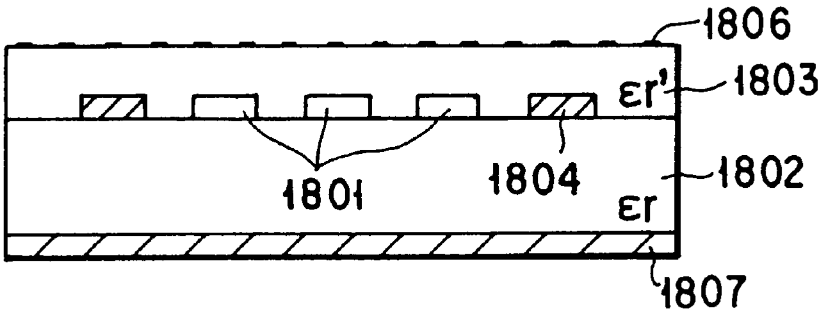
FIGS. 26A and 26B are views showing the structure of a twenty-fourth embodiment of a high-frequency device according to this invention in which a plurality of resonance elements are used to construct a filter unlike the case of the twenty-first embodiment.
Figure 26B:
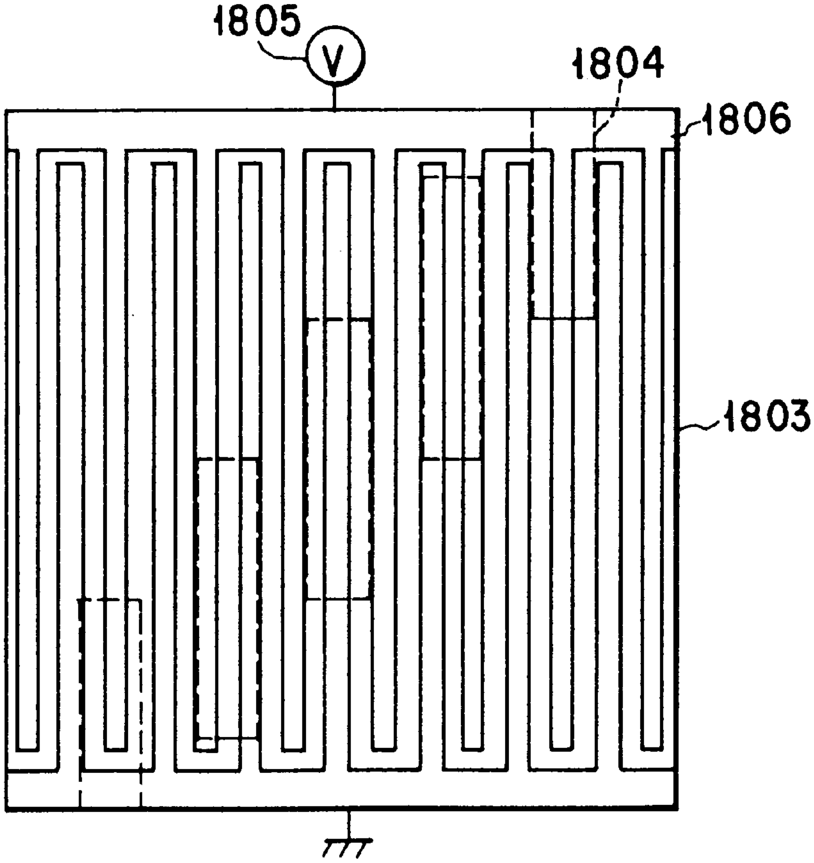

FIGS. 26A and 26B are views showing the high-frequency device according to the twenty-fourth embodiment of this invention. In the twenty-fourth embodiment, the high-frequency device of microstrip line structure constructed by a plurality of resonance elements 1801 (see FIG. 26A) and input/output lines 1804 formed on the front surface of a dielectric substrate 1802 with a relative permittivity $\epsilon_r$ and having a ground layer 1807 formed on the rear surface thereof is provided, as shown in FIG. 26A, a dielectric layer 1803 whose relative permittivity $\epsilon_r'$ is changed by application of a voltage (V) 1805 is formed on the resonance element 1801, interdigital voltage application electrodes 1806 having a thickness equal to or less than the skin depth δ expressed by the equation (4) are formed on the dielectric layer 1803, and a variable voltage source 1805 is connected to the voltage application electrodes 1806 to construct a filter. Also, in the twenty-fourth embodiment, the same effect as that obtained in the twentieth embodiment can be attained.

Next, the twenty-fifth embodiment of the high-frequency device according to this invention is explained with reference to FIGS. 27A to 31.

Figure 27A:
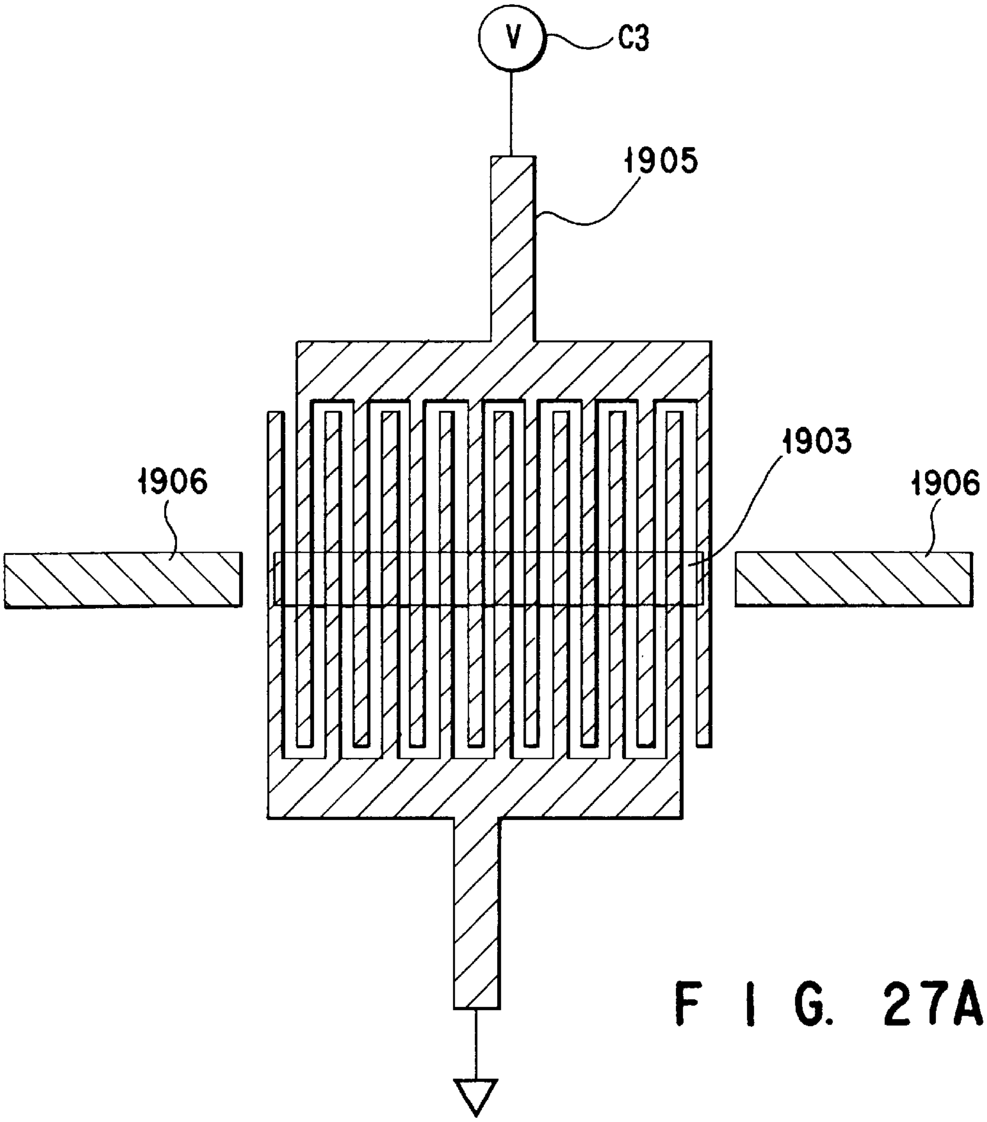
FIGS. 27A and 27B are views showing the structure of a twenty-fifth embodiment of a high-frequency device according to this invention in which the electrode is constructed in an interdigital form.
Figure 27B:
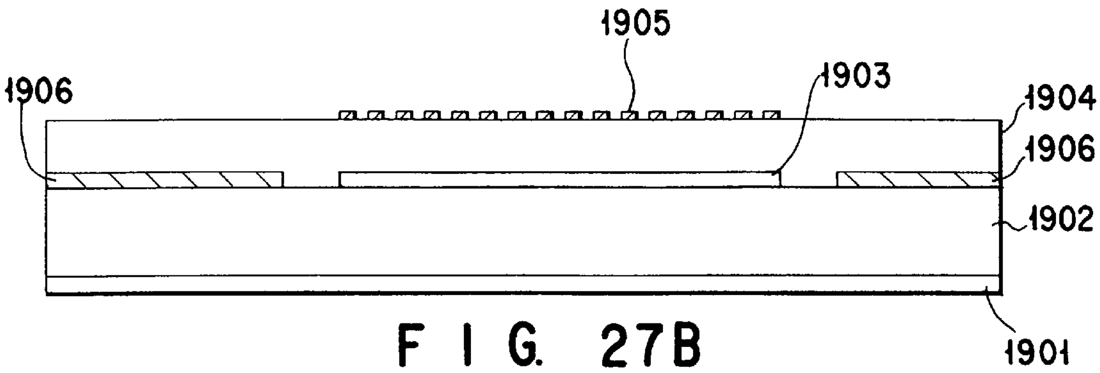

FIG. 27A shows the relation between a resonance element and electrodes in a plane in which the resonance element of the high-frequency device of the twenty-fifth embodiment is formed, and FIG. 27B is a cross sectional view of the high-frequency device of FIG. 27A. The resonator has a microstrip line structure constructed by a ground layer 1901 (see FIG. 27B), normal dielectric substance 1902 (see FIG. 27B) and resonance element 1903. In the twenty-fifth embodiment, a dielectric substance 1904 (see FIG. 27B) whose relative permittivity is changed by application of a voltage (V) C3 and electrodes 1905 for applying a voltage to the surface of the dielectric substance which lies in opposition to the resonance element are formed on the resonator and the voltage application element 1905 is formed in an interdigital form. A reference numeral 1906 indicates input/output elements.

As shown in FIG. 27A, the teeth direction of the voltage application element 1905 is set perpendicular to the resonance direction of the resonance element and the electrode teeth are combined in position at a distance at least two times larger than the width of the resonance element so that a voltage can be applied from one power source to the electrode teeth. Thus, since the coupling of the electromagnetic fields of the voltage application element 1905 can be suppressed by setting the teeth direction of the voltage application element 1905 perpendicular to the longitudinal direction of the resonance element 1903 of the resonator, the influence of the voltage application element 1905 on the mode of the resonating electromagnetic field of the resonance element can be suppressed.

Figure 28:
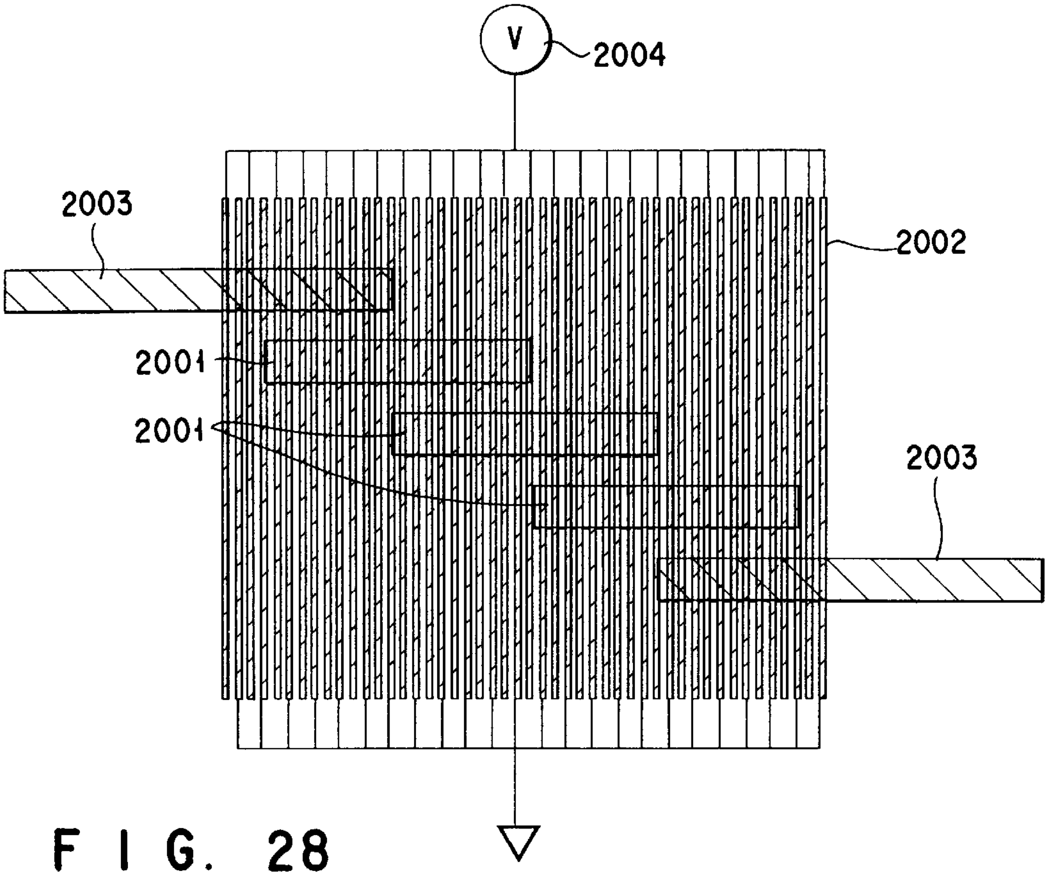
FIG. 28 is a view showing the structure obtained by applying the device of the twenty-fifth embodiment to a side-coupled filter.
Figure 29:
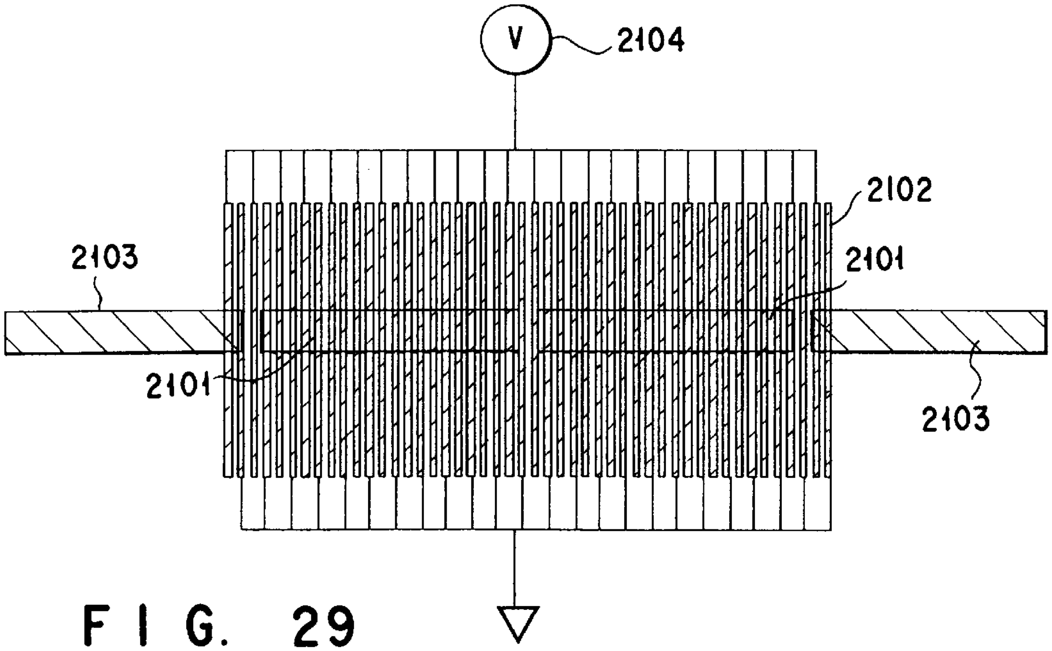
FIG. 29 is a view showing the structure obtained by applying the device of the twenty-fifth embodiment to an end-coupled filter.

The twenty-fifth embodiment may be applied to a filter, and FIG. 28 shows a case wherein this embodiment is applied to a side-coupled filter and FIG. 29 shows a case wherein the twenty-fifth embodiment is applied to an end-coupled filter. In this case, reference numerals 2001, 2101 denote resonance elements, 2002, 2102 denote a voltage application element, 2003, 2103 denote an input/output element, and 2004, 2104 denote a voltage source having a voltage V, respectively, as shown in FIGS. 28, 29.

Figure 30:
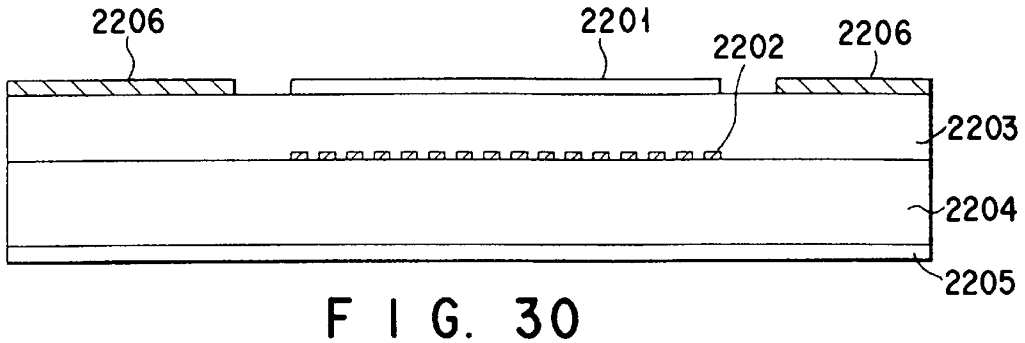
FIG. 30 is a view showing the structure of a first modification of the device of the twenty-fifth embodiment.

Further, the high-frequency device of the twenty-fifth embodiment can be variously modified and, for example, the electrodes can be disposed between the resonance element and the ground layer as shown in FIG. 30.

That is, electrodes 2202 of interdigital form as described before are formed on a dielectric layer 2204 formed on a ground layer 2205 and a dielectric layer 2203 whose relative permittivity is changed by application of voltage is formed on the dielectric layer 2204 and voltage application element 2202. A resonance element 2201 and input/output terminals 2206 are disposed on the dielectric layer 2203. With this structure, the same effect as that of the twenty-fifth embodiment can be attained.

Figure 31:
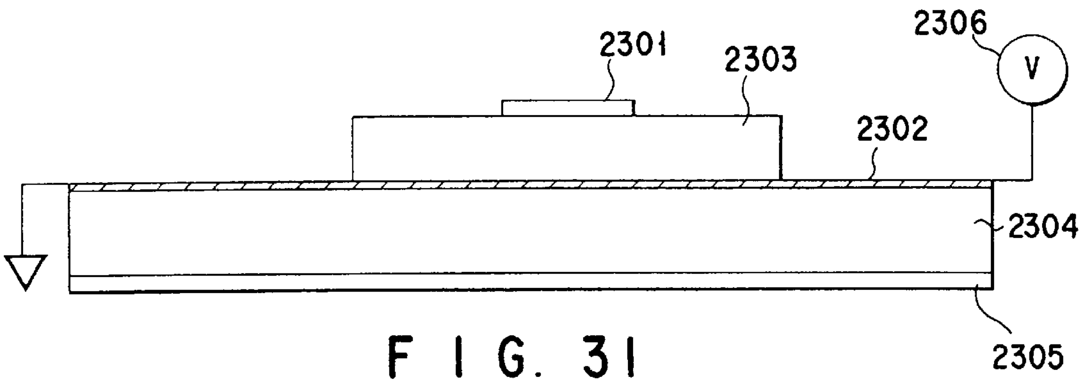
FIG. 31 is a view showing the structure of a second modification of the device of the twenty-fifth embodiment.

Further, as shown in FIG. 31, it is possible to form a dielectric layer only on a portion necessary for the resonance element and supply a voltage from an external voltage source to the voltage application element formed in the internal portion via a portion in which no dielectric layer is formed.

That is, a voltage application element 2302 is formed on a dielectric layer 2304 formed on a ground layer 2305 and a dielectric layer 2303 whose permittivity is changed by application of a voltage V is formed on the voltage application element 2302 by an amount necessary for holding the resonance element 2301. The resonance element 2301 is formed on the dielectric layer 2303. Further, a portion of the voltage application element 2302 formed on the dielectric layer 2304 on which the dielectric layer 2303 is not formed is connected to an external voltage source 2306. With this structure, the same effect as that of the twenty-fifth embodiment can be attained.

As described above, according to this invention, the resonance characteristic can be changed in a simple construction in the eighth to twenty-fifth embodiments in which the permittivity of the dielectric substance formed near the resonance element is changed by application of voltage, and when a superconductor is used for the resonance element, a high-frequency device with large unloaded Q value can be provided without sacrificing the low loss property of the superconductor.

Next, still other embodiment of the high-frequency device according to this invention is explained with reference to the accompanying drawings.

Next, the twenty-sixth embodiment of the high-frequency device according to this invention is explained with reference to FIG. 32.

Figure 32:
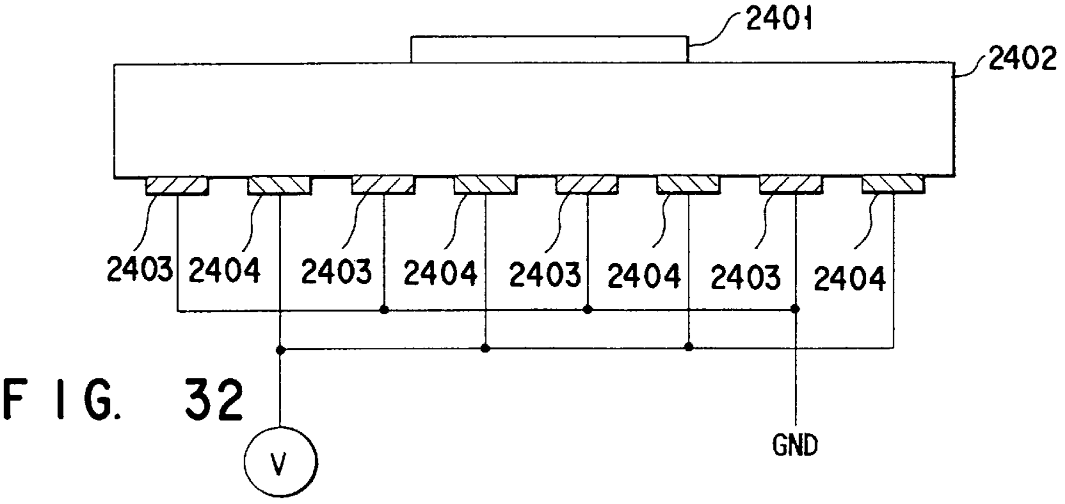
FIG. 32 is a cross sectional view showing the structure of a twenty-sixth embodiment of a high-frequency device according to this invention.

FIG. 32 is a cross sectional view showing the high-frequency device according to the twenty-sixth embodiment of this invention. The twenty-sixth embodiment has a structure similar to that of the twenty-fifth embodiment. However, unlike the twenty-fifth embodiment, in this embodiment, a ground layer which is one of elements to constitute a resonator is divided a plurality of grounds and formed on a dielectric layer. Furthermore, a plurality of electrodes are formed between the grounds respectively so that the grounds and the electrodes are formed on the dielectric layer in turn.

More specifically, a resonance element 2401 is formed on the front surface of a dielectric layer 2402, and ground 2403 and electrodes (voltage application elements) 2404 described above are formed on the rear surface of the dielectric layer 2402. The ground 2403 and electrodes 2404 are set in the superconducting state. As shown in FIG. 32, the grounds 2403 are set to the ground potential and a preset voltage V is applied to the electrodes 2404. As a result, the permittivity of the dielectric layer 2402 can be changed and the resonance frequency of the resonance element 2401 can be changed.

As described above, according to the twenty-sixth embodiment of this invention, the resonance frequency can be changed in a simple construction, and when a superconductor is used for the resonance element, a high-frequency device with large unloaded Q value can be provided in which the resonance frequency can be rapidly changed in a wide range without sacrificing the low loss property of the superconductor.

Next, various embodiments of the high-frequency device according to this invention in which the resonance frequency is controlled by use of light or heat are explained.

Figure 33:
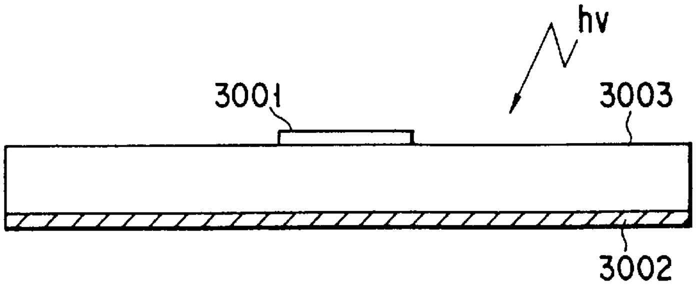
FIG. 33 is a cross sectional view showing the structure of a twenty-seventh embodiment of a high-frequency device according to this invention.

First, the twenty-seventh embodiment of the high-frequency device according to this invention is explained with reference to FIG. 33.

In the twenty-seventh embodiment of this invention, a resonator is constructed by a resonance element 3001, a ground layer 3002, and a dielectric layer 3003 whose relative permittivity is changed by application of light and constructs a microstrip line resonator. When light is applied to the dielectric layer from the exterior, the permittivity of the dielectric layer is changed according to the intensity of light. Then, the impedance of the resonator and the effective resonator length can be changed, thereby making it possible to change the resonance frequency. As a material whose permittivity is changed by application of light, $BaTiO_3$, LiNbO, $LiTaO_3$ and the like are used.

Next, the twenty-eighth embodiment of the high-frequency device according to this invention is explained with reference to FIGS. 34A and 34B.

Figure 34A:
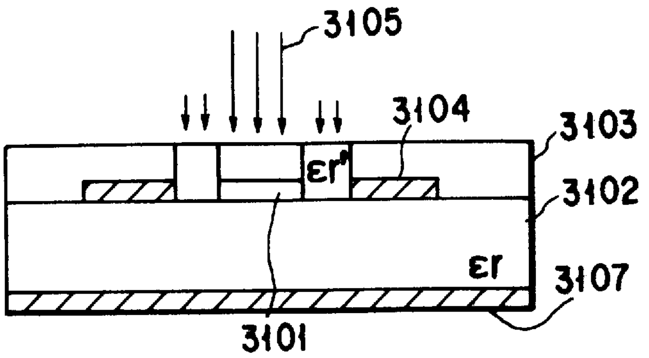
FIGS. 34A and 34B are views showing the structure of a twenty-eighth embodiment of a high-frequency device according to this invention.
Figure 34B:
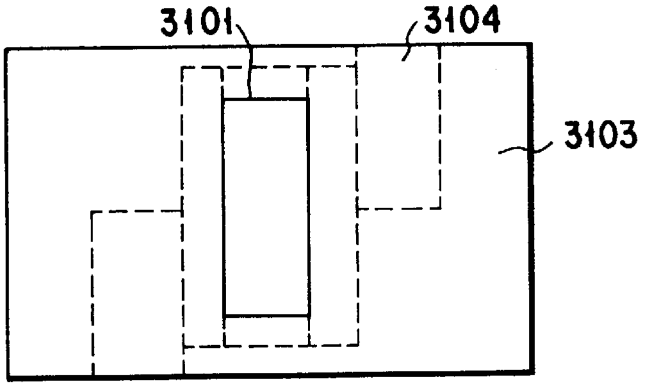

FIGS. 34A and 34B are views showing the high-frequency device according to the twenty-eighth embodiment of this invention in which the frequency can be changed by use of a dielectric material whose permittivity is changed by application of light.

That is, in the twenty-eighth embodiment, a resonance element 3101 and input/output lines 3104 are formed on a dielectric substrate 3102 with a relative permittivity $\epsilon_r$ and having ground layer 3107 formed on a rear surface thereof (see FIG. 34A) and a dielectric layer 3103 whose relative permittivity $\epsilon_r'$ is changed by application of light 3105 (see FIG. 34A) is formed on the dielectric substrate 3102. In this case, the permittivity distribution of the dielectric layer 3103 can be set to a desired distribution by applying lights of different amounts to a portion in which the impedance of the resonance element 3101 is changed (indicated by a broken line) and another portion in which the coupling amount is adjusted, and as a result, the resonance frequency of the resonance element 3101 can be changed.

Next, the twenty-ninth embodiment of the high-frequency device according to this invention is explained with reference to FIGS. 35A and 35B.

Figure 35A:
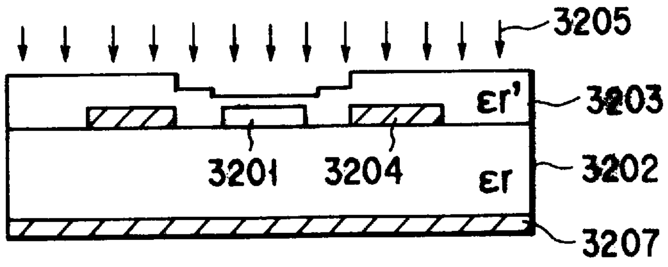
FIGS. 35A and 35B are views showing the structure of a twenty-ninth embodiment of a high-frequency device according to this invention.
Figure 35B:
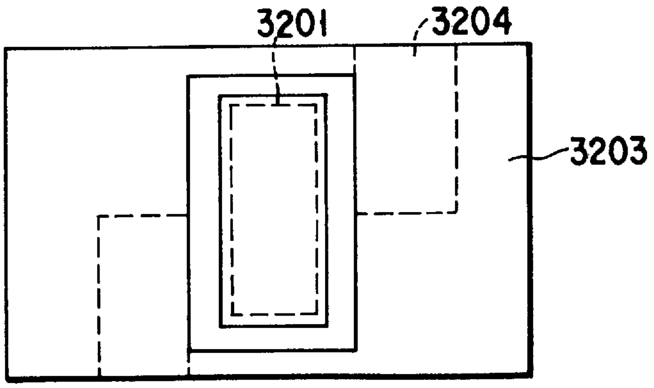

FIGS. 35A and 35B are views showing the high-frequency device according to the twenty-ninth embodiment of this invention. Like the twenty-eighth embodiment, in the twenty-ninth embodiment, a dielectric material whose relative permittivity is changed by application of light is used, but the application amount of light is made constant and a desired dielectric distribution is attained by changing the thickness of the dielectric layer to change the effective intensity of light.

That is, in this embodiment, a resonance element 3201 and input/output lines 3204 are formed on a dielectric substrate 3202 with a relative permittivity $\epsilon_r$ and having a ground layer 3207 formed on a rear surface thereof (see FIG. 35A), and a dielectric layer 3203 whose relative permittivity $\epsilon_r'$ is changed by application of light 3205 (see FIG. 35A) is formed on the dielectric substrate 3202. In this case, the permittivity distribution of the dielectric layer 3203 can be set to a desired distribution by applying lights of constant amounts to preset thickness distribution, and as a result, the resonance frequency of the resonance element 3201 can be changed.

Further, in modifications of the twenty-eighth and twenty-ninth embodiments, a dielectric material whose permittivity is changed by application of energy such as heat other than light can be used.

Next, the thirtieth embodiment of the high-frequency device according to this invention is explained with reference to FIG. 36.

Figure 36:
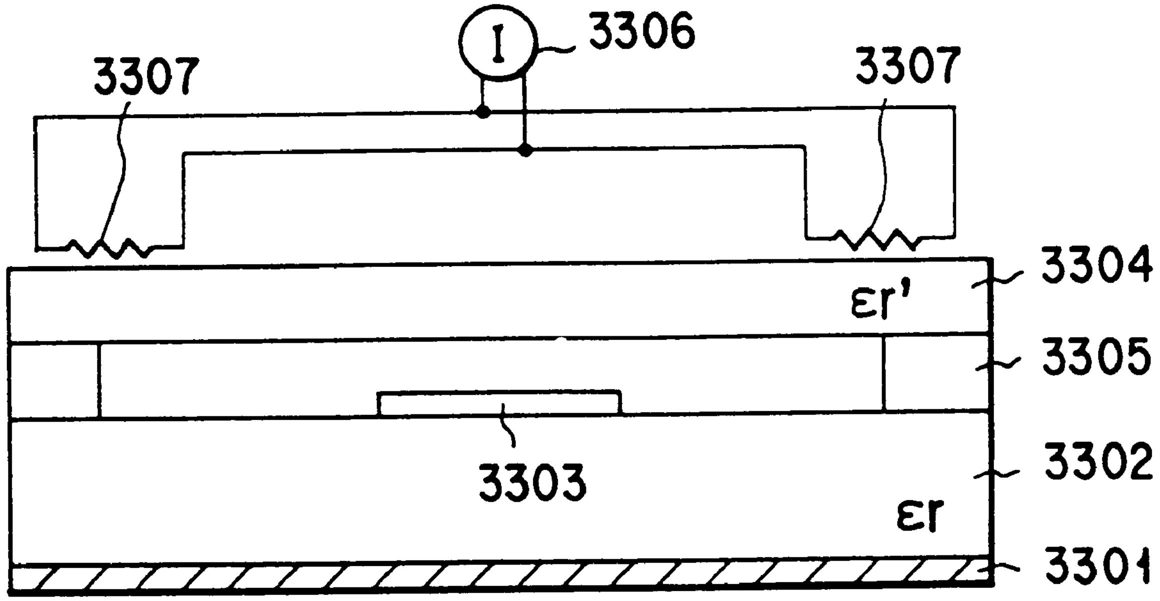
FIG. 36 is a cross sectional view showing the structure of a thirtieth embodiment of a high-frequency device according to this invention which is constructed to control the device of the twelfth embodiment by heat.

FIG. 36 is a cross sectional view showing the high-frequency device according to the thirtieth embodiment of this invention. In the thirtieth embodiment, the microstrip line structure is constructed by a resonance element 3303 of superconductor on the front surface of a dielectric substrate 3302 with relative permittivity $\epsilon_r$ having a ground layer 3301 formed on the rear surface thereof, and like the eleventh and twelfth embodiments, the superconductor of the resonance element 3303 is formed of a material having a lattice constant approximately equal to that of the dielectric substrate 3302. Further, a. dielectric layer 3304 whose relative permittivity $\epsilon_r'$ ($\epsilon_r' \neq \epsilon_r$) is changed by application of heat is formed on the dielectric substrate 3302 while a spacer 3305 having a thickness larger than that of the resonance element 3303 is disposed therebetween, and a heating element 3307 is disposed above the dielectric layer 3304 and the heating element 3307 is energized by a current source 3306 having a current I.

In this example, a dielectric material whose permittivity is changed by application of heat is used for the dielectric layer 3304. As one example, the dielectric layer 3304 is formed of a material in which the rate of variation in the permittivity with temperature at the operation temperature is high and $SrTiO_3$ which is one type of ferroelectric material and the like can be used. The resonance frequency can be changed by changing the permittivity of the dielectric layer 3304 by application of heat from the heating element 3307. At this time, in order to prevent heat from being transmitted from the dielectric layer 3304 to the resonance element 3303 formed of superconductor, the spacer 3305 is disposed to separate the dielectric layer 3304 from the resonance element 3303, and therefore, the resonance frequency can be changed without deteriorating the superconducting characteristic. In this case, it is preferable to form the spacer 3305 in a ring form, set up a vacuum state in a space portion around the resonance element 3303 surrounded by the spacer 3305, and use a heat shielding material as the material of the spacer 3305.

Thus, according to the thirtieth embodiment, the impedance of the resonance element 3303 can be changed without deteriorating the superconducting characteristic by changing the permittivity of the dielectric layer 3304 by application of heat without using a large-scale magnetic field generating source for generating an intense magnetic field to deteriorate the superconducting characteristic, and thus the resonance characteristic such as the resonance frequency can be changed.

As described above, according to this invention, the resonance characteristic can be changed in a simple construction in the twenty-seventh to thirtieth embodiments in which the permittivity of the dielectric substance formed near the resonance element is changed by application of heat or light, and when a superconductor is used for the resonance element, a high-frequency device with large unloaded Q value can be provided without sacrificing the low loss property of the superconductor.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A high-frequency device comprising:

a resonator having a substrate and a superconductor resonance element provided on the substrate;

a dielectric layer provided on or above said resonator, a permittivity of said dielectric layer being changed according to an electric field applied thereto;

a plurality of electrodes provided on said dielectric layer and separate from said resonator; and applying means for applying a voltage to said plurality of electrodes, said applied voltage generating said electric field to change the permittivity of said dielectric layer and said change in permittivity changing a resonance frequency of said resonator.

2. A high-frequency device according to claim 1, wherein said applying means applies different voltages to said plurality of electrodes.

3. A high-frequency device according to claim 1, wherein said plurality of electrodes are in a interdigital form.

4. A high-frequency device according to claim 3, wherein said plurality of electrodes are arranged in parallel with a longitudinal direction of said resonance element.

5. A high-frequency device according to claim 1, wherein said dielectric layer is provided in the electric field caused when said applying means applies said voltage to said plurality of electrodes.

6. A high-frequency device according to claim 1, wherein said plurality of electrodes are arranged at preset different intervals.

7. A high-frequency device according to claim 1, wherein said resonance element has a gap in a preset portion thereof.

8. A high-frequency device according to claim 3, wherein said plurality of electrodes are arranged perpendicular to a longitudinal direction of said resonance element.

9. A high-frequency device comprising:

a resonator having a substrate and a superconductor resonance element provided on the substrate;

a dielectric layer provided on or above said resonator, a permittivity of said dielectric layer being changed according to an electric field applied thereto;

a plurality of electrodes provided on said dielectric layer and separate from said resonator; and applying means for applying different voltages to said plurality of electrodes, said applied voltage generating said electric field to change the permittivity of said dielectric layer, and said change in permittivity changing a resonance frequency of said resonator.

10. A high-frequency device comprising:

a resonator having a substrate and a superconductor resonance element provided at a central portion of the substrate;

a dielectric layer provided on said resonator; and a plurality of electrodes comprising an interdigital form provided on said dielectric layer.

11. A high-frequency device comprising:

a resonator having a substrate and a superconductor resonance element provided at a central portion of the substrate;

a dielectric layer provided on said resonator;

a plurality of interdigital electrodes provided on said dielectric layer and arranged perpendicular to a longitudinal direction of said resonance element; and voltage applying means for applying a voltage to said plurality of electrodes to set a desired permittivity distribution on said dielectric substance.

* * * * *